(12) United States Patent
Lee et al.

(10) Patent No.: US 12,015,064 B2
(45) Date of Patent: Jun. 18, 2024

(54) SEMICONDUCTOR DEVICES HAVING SUPPORTER STRUCTURES

(71) Applicant: Samsung Electronics Co., Ltd., Suwon-si (KR)

(72) Inventors: Hoin Lee, Hwaseong-si (KR); Kiseok Lee, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 192 days.

(21) Appl. No.: 17/683,765

(22) Filed: Mar. 1, 2022

(65) Prior Publication Data

US 2023/0035660 A1 Feb. 2, 2023

(30) Foreign Application Priority Data

Jul. 30, 2021 (KR) .................. 10-2021-0100794

(51) Int. Cl.
*H01L 29/423* (2006.01)
*H01L 29/40* (2006.01)

(52) U.S. Cl.
CPC .......... *H01L 29/423* (2013.01); *H01L 29/402* (2013.01)

(58) Field of Classification Search
CPC ..... H01L 29/423; H01L 29/402; H01L 28/90; H10B 12/033; H10B 12/315; H10B 12/34
See application file for complete search history.

(56) References Cited

U.S. PATENT DOCUMENTS

| | | | |
|---|---|---|---|
| 7,781,297 B2 | 8/2010 | Seo | |
| 8,343,845 B2 | 1/2013 | Kim et al. | |
| 9,871,093 B2 | 1/2018 | Kim et al. | |
| 10,535,661 B2 | 1/2020 | Yokoyama | |
| 2004/0056295 A1 | 3/2004 | Agarwal et al. | |
| 2008/0242042 A1 | 10/2008 | Kim et al. | |
| 2012/0104559 A1* | 5/2012 | Kim | H01L 23/585 |
| | | | 257/618 |
| 2020/0144269 A1 | 5/2020 | Kim et al. | |

FOREIGN PATENT DOCUMENTS

| KR | 2005-0002358 A | 1/2005 |
|---|---|---|
| KR | 2009-0044553 A | 5/2009 |

OTHER PUBLICATIONS

Office Action for corresponding Taiwanese Patent Application No. 111112536 dated Feb. 3, 2023.

* cited by examiner

*Primary Examiner* — Mohammed R Alam
(74) *Attorney, Agent, or Firm* — Harness, Dickey & Pierce, P.L.C.

(57) ABSTRACT

A semiconductor device includes lower electrodes, a first supporter structure including first supporter patterns interconnecting the lower electrodes, wherein side surfaces of the first supporter patterns and side surfaces of the lower electrodes that are exposed by the first supporter patterns at least partially define a first open region, the first supporter patterns being spaced apart from one another, the first open region extending among the first supporter patterns in a horizontal direction, a dielectric layer covering the first supporter structure and the lower electrodes, and an upper electrode on the dielectric layer. A distance between adjacent ones of the first supporter patterns is smaller than or equal to a pitch of the lower electrodes.

20 Claims, 28 Drawing Sheets

SEMICONDUCTOR DEVICES HAVING SUPPORTER STRUCTURES

CROSS-REFERENCE TO RELATED APPLICATION

This application claims priority from Korean Patent Application No. 10-2021-0100794, filed on Jul. 30, 2021, in the Korean Intellectual Property Office, the disclosure of which is incorporated herein by reference in its entirety.

BACKGROUND

1. Field

The example embodiments of the inventive concepts relate to a semiconductor device having a supporter structure.

2. Description of the Related Art

In accordance with demand for high integration and miniaturization of a semiconductor device, a capacitor of such a semiconductor device is being scaled down in size. Accordingly, a lower electrode having a high aspect ratio is required in order to enable a capacitor disposed in a fine pattern to secure a predetermined capacitance.

SUMMARY

Some example embodiments of the inventive concepts provide a semiconductor device including a supporter structure having supporter patterns, and an open region extending among the supporter patterns. The supporter structure may support lower electrodes of the semiconductor device as described herein, for example to reduce or prevent leaning of the lower electrodes during execution of a process (e.g., a manufacturing process to complete manufacture of the semiconductor device.

A semiconductor device according to some example embodiments of the inventive concepts may include lower electrodes, a first supporter structure including first supporter patterns interconnecting the lower electrodes, wherein side surfaces of the first supporter patterns and side surfaces of the lower electrodes that are exposed by the first supporter patterns at least partially define a first open region, the first supporter patterns being disposed to be spaced apart from one another, the first open region extending among the first supporter patterns in a horizontal direction, a dielectric layer covering the first supporter structure and the lower electrodes, and an upper electrode on the dielectric layer. A distance between adjacent ones of the first supporter patterns may be smaller than or equal to a pitch of the lower electrodes.

A semiconductor device according to some example embodiments of the inventive concepts may include a substrate including a cell area and a peripheral circuit area, lower electrodes disposed on the substrate in the cell area. A first supporter structure including first supporter patterns interconnecting the lower electrodes, wherein side surfaces of the first supporter patterns and side surfaces of the lower electrodes that are exposed by the first supporter patterns at least partially define a first open region, and dam structures at an edge of the cell area, the first open region extending among the first supporter patterns in a horizontal direction, the dam structures being disposed to be spaced apart from one another, a dielectric layer covering the first supporter structure and the lower electrodes, and an upper electrode on the dielectric layer. A distance between adjacent ones of the first supporter patterns may be smaller than or equal to a pitch of the lower electrodes.

A semiconductor device according to some example embodiments of the inventive concepts may include lower electrodes on landing pads, the lower electrodes defining a honeycomb structure, a first supporter structure including first supporter patterns interconnecting the lower electrodes, and wherein side surfaces of the first supporter patterns and side surfaces of the lower electrodes that are exposed by the first supporter patterns at least partially define a first open region, the first supporter patterns being disposed to be spaced apart from one another, the first open region extending among the first supporter patterns in a horizontal direction, a second supporter structure including a supporter plate interconnecting the lower electrodes, and the supporter plate having inner walls that at least partially define separate, respective open holes inside of the supporter plate, the second supporter structure being on the first supporter structure, an upper surface of the second supporter structure being at a same level as upper surfaces of the lower electrodes, a dielectric layer covering the second supporter structure and the lower electrodes, and an upper electrode on the dielectric layer. A distance between adjacent ones of the first supporter patterns may be smaller than or equal to a pitch of the lower electrodes. A thickness of the second supporter structure may be greater than a thickness of the first supporter structure. The open holes may be disposed to be spaced apart from one another, and the supporter plate may extend among the open holes in the horizontal direction.

DETAILED DESCRIPTION

Figure 1A:
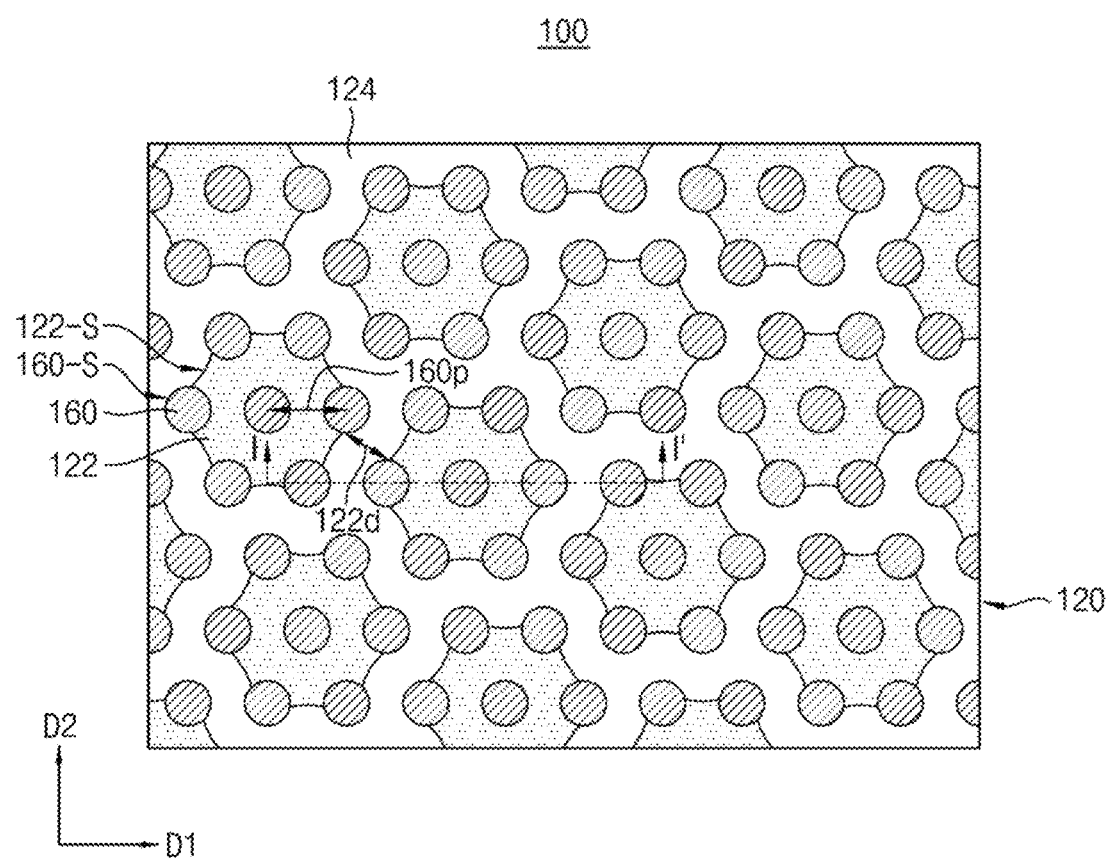
FIG. 1A is a plan view of a semiconductor device according to some example embodiments of the inventive concepts.

Hereinafter, some example embodiments according to the spirit and scope of the present inventive concepts will be described with reference to the accompanying drawings. In the description of FIGS. 1A to 24, the same reference numerals are used for substantially the same components, and duplicate descriptions of the corresponding components will be omitted. Also, similar reference numerals are used for similar components throughout various drawings of the present inventive concepts.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 1B:
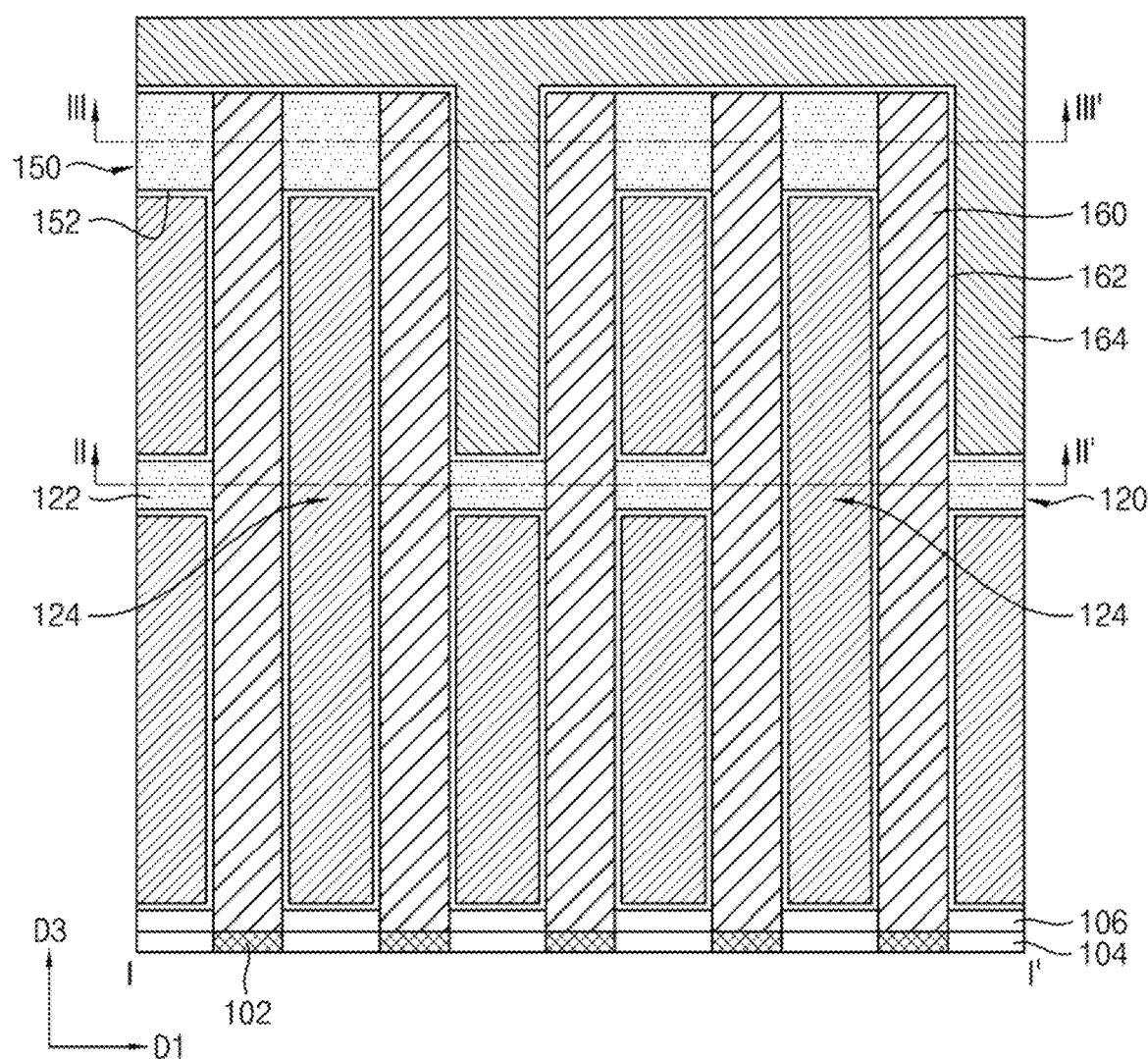
FIG. 1B is a vertical cross-sectional view of the semiconductor device taken along line I-I' shown in FIG. 1A.
Figure 1C:
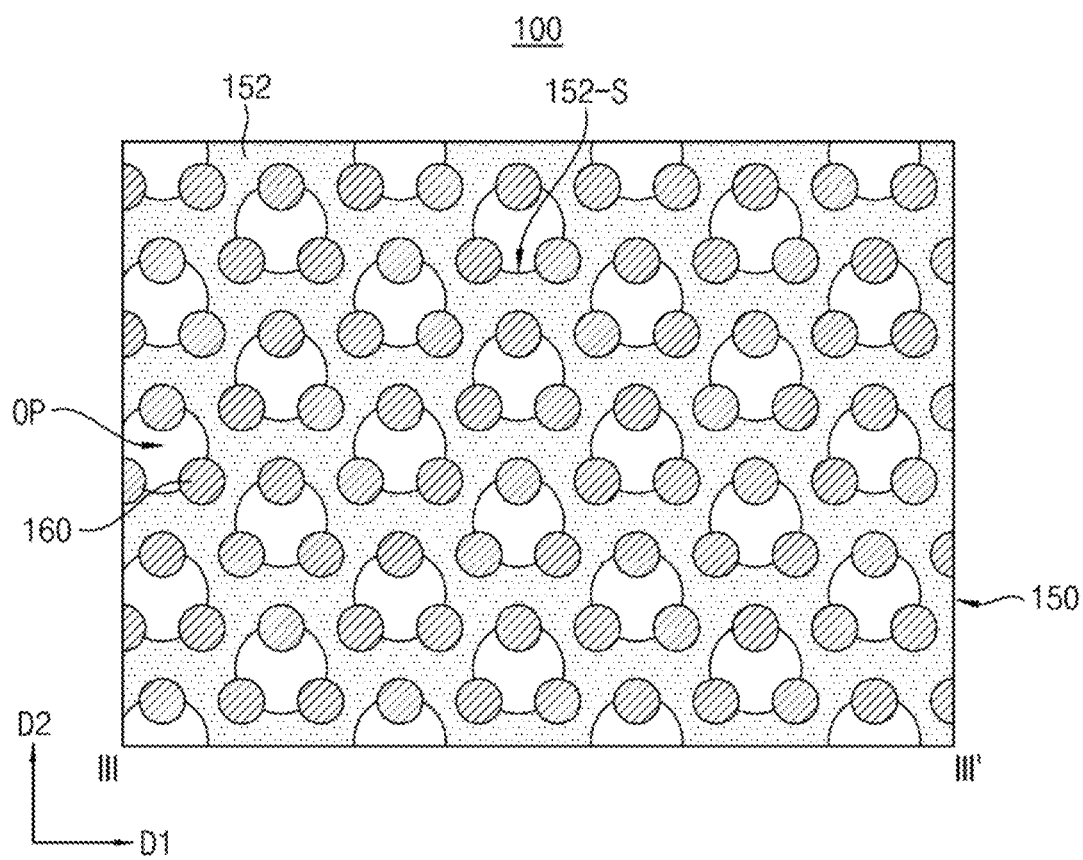
FIG. 1C is a plan view of the semiconductor device taken along line shown in FIG. 1B.

FIG. 1A is a plan view of a semiconductor device according to some example embodiments of the inventive concepts. FIG. 1B is a vertical cross-sectional view of the semiconductor device taken along line I-I' in FIG. 1. FIG. 1C is a plan view of the semiconductor device taken along line in FIG. 1B. FIG. 1A is a vertical cross-sectional view of the semiconductor device taken along line II-II' in FIG. 1B.

Referring to FIGS. 1A to 1C, a semiconductor device 100 may include a landing pad 102, an insulating structure 104, an etch stop layer 106, a first supporter structure 120, a second supporter structure 150, a lower electrode 160, a dielectric layer 162, and an upper electrode 164. The first supporter structure 120 and/or the second supporter structure 150 may be configured to support one or more lower electrodes 160 of the semiconductor device 100 as described herein, for example to reduce or prevent leaning of the one or more lower electrodes 160 during execution of a process (e.g., a manufacturing process to complete manufacture of the semiconductor device 100.

Landing pads 102 may be disposed among insulating structures 104. An upper surface of the landing pad 102 may be disposed at the same level as an upper surface of the insulating structure 104, without being limited thereto. In some example embodiments, the upper surface of the landing pad 102 may be disposed at a lower level than the upper surface of the insulating structure 104. The upper surface of the landing pad 102 may contact a bottom surface of the lower electrode 160, and the landing pad 102 may be electrically connected to the lower electrode 160. The insulating structure 104 may electrically insulate the landing pads 102. In some example embodiments, the landing pad 102 may include a conductive material such as tungsten. The insulating structure 104 may include an insulating material such as silicon oxide.

In the present specification, the term 'level' may mean a vertical height and/or a distance from a reference location (e.g., one or more of the upper surface of one or more of the insulating structures 104, the upper surface of one or more of the landing pads 102, the lower surface of one or more of the etch stop layers 106, a lower surface of one or more of the lower electrodes 160, or the like) in a vertical direction (e.g., the vertical direction D3, which may be a vertical direction that extends perpendicular or substantially perpendicular to at least one of the upper surface of one or more of the insulating structures 104, the upper surface of one or more of the landing pads 102, the lower surface of one or more of the etch stop layers 106, a lower surface of one or more of the lower electrodes 160, or the like). A reference location may be understood to be a location that a level and/or relative level of an element is "based on." For example, when a first element is described herein to be at a level higher than a second element, the first element may be further from the reference location in the vertical direction (e.g., vertical direction D3) than the second element. In another example, when a first element is described herein to be at a level lower than a second element, the first element may be closer to reference location in the vertical direction than the second element. In another example, when a first element is described herein to be at a same or substantially same level as a second element, the first element may be equally distant from/close to the reference location in the vertical direction (e.g., vertical direction D3) as the second element.

The etch stop layer 106 may be disposed on the insulating structure 104. In some example embodiments, the etch stop layer 106 may include silicon nitride, silicon oxynitride, or a combination thereof. The etch stop layer 106 may prevent an etchant from flowing under the lower electrode 160 during a wet etching process, thereby preventing the insulating structure 104 from being etched.

The first supporter structure 120 and the second supporter structure 150 may be disposed among lower electrodes 160. An upper surface of the first supporter structure 120 may be at a lower level than upper surfaces of the lower electrodes 160. The first supporter structure 120 and the second supporter structure 150 may be disposed to be vertically spaced apart from each other, and the second supporter structure 150 may be disposed on the first supporter structure 120. An upper surface of the second supporter structure 150 may be disposed at the same level as an upper surface of the lower electrode 160. The first supporter structure 120 and the second supporter structure 150 may support the lower electrodes 160 while interconnecting the lower electrodes 160. The first supporter structure 120 and the second supporter structure 150 may include an insulating material, and may include, for example, silicon nitride, silicon oxynitride, or a combination thereof.

As shown in FIG. 1A, the first supporter structure 120 may include supporter patterns 122 (also referred to herein as first supporter patterns) disposed to be spaced apart from one another by a uniform distance (e.g., a fixed distance), and an open region 124 among the supporter patterns 122. As shown in at least FIGS. 1A-1C, side surfaces 122-S of the supporter patterns 122 may at least partially define, at least in the horizontal plane (e.g., D1-D2 plane), the open region 124 extending between the supporter patterns 122. As shown in at least FIGS. 1A-1C, side surfaces 122-S of the support patterns 122 and exposed side surfaces of the lower electrodes 160 (e.g., side surfaces of the lower electrodes 160 that are exposed by and/or from the supporter patterns 122) may at least partially define, at least in the horizontal plane (e.g., D1-D2 plane), the open region 124 extending among (e.g., between) the supporter patterns 122 in one or more horizontal directions D1 and/or D2. The supporter patterns 122 may be disposed to be spaced apart from one another (e.g., isolated from direct contact with each other), and the open region 124 may horizontally extend among the supporter patterns 122. Each supporter pattern 122 may be surrounded by the open region 124. In some example embodiments, each supporter pattern 122 may contact seven lower electrodes 160. For example, as shown in at least FIG. 1A, each supporter pattern 122 may partially contact six lower electrodes 160 of the lower electrodes 160 that are at a circumference of the supporter pattern 122, and may surround one lower electrode 160 of the lower electrodes 160 (where the one lower electrode 160 may be in an interior of the supporter pattern 122 and/or at a center of the supporter pattern 122). In some embodiments, the supporter pattern 122 may contact three, four or more lower electrodes 160. In some example embodiments, the distance between adjacent ones of the supporter patterns 122 may be smaller than or equal to the pitch of the lower electrodes 160. A side surface of the supporter pattern 122 may contact the lower electrode 160, and may be rounded. For example, a side surface of the supporter pattern 122, which is exposed to the open region 124, may be concave, and may have a recessed shape.

The thickness of the second supporter structure 150 may be greater than the thickness of the first supporter structure 120. As shown in FIG. 1C, the second supporter structure 150 may include a plate-shaped supporter plate 152, and open holes OP formed inside of the supporter plate 152. For example, as shown in at least FIG. 1C, the supporter plate 152 may have inner walls 152-S that each at least partially define separate, respective open holes OP inside the supporter plate 152 (e.g., extending between opposite, lower and upper surfaces of the supporter plate 152 within a volume space defined by outermost side surfaces and the upper and lower surfaces of the supporter plate 152). As shown, the open holes OP that may be at least partially defined by inner walls 152-S may be disposed to be spaced apart from one another (e.g., spaced apart by a uniform distance), and the supporter plate 152 nay extend among (e.g., between) the open holes OP in a horizontal direction (e.g., the first and/or second horizontal directions D1 and/or D2). For example, the open holes OP may be arranged such that the open holes OP form columns in a second horizontal direction D2, and the open holes OP in adjacent ones of the columns may be disposed to be misaligned from each other in a first horizontal direction D1. As shown in at least FIG. 1C, one or more open holes OP may each at least partially expose, from at least the supporter plate 152, three separate lower electrodes 160 that are adjacent to one another. The open holes OP may be disposed to be spaced apart from one another, and the supporter plate 152 may horizontally extend among the open holes OP.

As described above, the lower electrodes 160 may be disposed on the landing pads 102, respectively. The lower electrode 160 may be electrically connected to the landing pad 102. Referring to FIG. 1A, when viewed in a top plan view, the lower electrodes 160 may be disposed to be spaced apart from one another by a uniform distance. In some example embodiments, the lower electrodes 160 may have (e.g., may define) a honeycomb structure in which the lower electrodes 160 are disposed at a center of a hexagon and vertexes of the hexagon, respectively. The lower electrode 160 may include a metal such as Ti, W, Ni and Co or a metal nitride such as TiN, TiSiN, TiAlN, TaN, TaSiN, WN, etc. In some example embodiments, the lower electrode 160 may include TiN. In some example embodiments, the lower electrode 160 may have a pillar shape, without being limited thereto.

The dielectric layer 162 may be disposed between the lower electrode 160 and the upper electrode 164. For example, the dielectric layer 162 may be conformally disposed at surfaces of the etch stop layer 106, the first supporter structure 120, the second supporter structure 150 and the lower electrode 160. The dielectric layer 162 may include a metal oxide such as $HfO_2$, $ZrO_2$, $Al_2O_3$, $La_2O_3$, $Ta_2O_3$, and $TiO_2$, a dielectric material having a perovskite structure such as $SrTiO_3$(STO), $BaTiO_3$, PZT and PLZT, or a combination thereof.

The upper electrode 164 may be disposed on the dielectric layer 162. The upper electrode 164 may fill the open region 124 of the first supporter structure 120 and the open holes OP of the second supporter structure 150. The upper electrode 164 may include a metal such as Ti, W, Ni and Co or a metal nitride such as TiN, TiSiN, TiAlN, TaN, TaSiN, WN, etc. In some example embodiments, the upper electrode 164 may include TiN.

Figure 2:
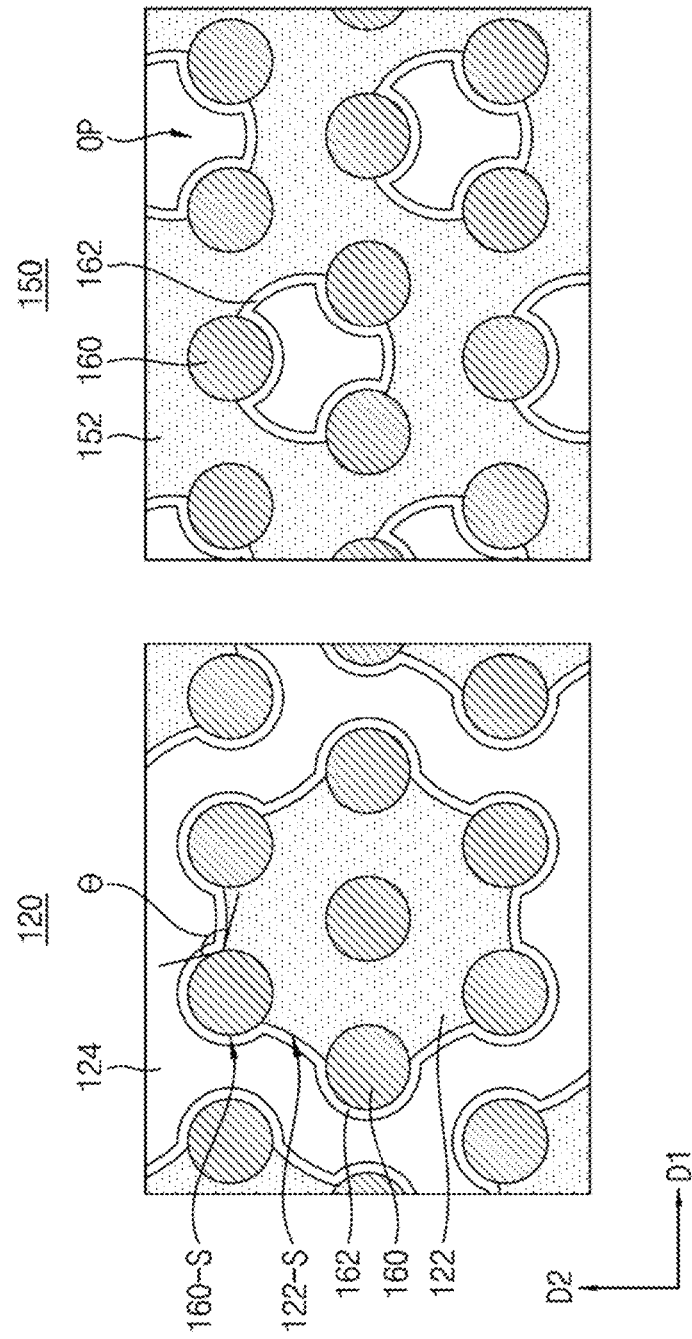
FIG. 2 is enlarged views of the support structures shown in FIGS. 1A and 1C.

FIG. 2 is enlarged views of the supporter structures shown in FIGS. 1A and 1C.

Referring to FIG. 2, the dielectric layer 162 may surround the supporter pattern 122 of the first supporter structure 120 and the lower electrode 160. For example, the dielectric layer 162 may extend along the side surface 122-S of the supporter pattern 122 exposed by the open region 124 and side surfaces 160-S of the lower electrodes 160 contacting the supporter pattern 122 (e.g., the six lower electrodes 160 partially contacted by the supporter pattern 122). The lower electrode 160, which is disposed inside of the supporter pattern 122, may not contact the dielectric layer 162. Restated, the one lower electrode 160 that is surrounded by the supporter pattern 122 may not be in contact with (e.g., may be isolated from direct contact from) the dielectric layer 162, for example by at least the supporter pattern 122 that surrounds the one lower electrode 160. For example, referring to FIG. 1B, a portion of the lower electrode 160, which is surrounded by the supporter pattern 122 at the same vertical level as the first supporter structure 120, may not contact the dielectric layer 162. It will be understood that the dielectric layer 162 may cover a first supporter structure 120 and the lower electrodes 160.

In some example embodiments, a side surface 160-S of the lower electrode 160 disposed at a circumference of the supporter pattern 122 and the side surface 122-S of the supporter pattern 122 may contact each other at an obtuse angle. For example, an angle θ between the side surface 160-S of the lower electrode 160 and the side surface 122-S of the supporter pattern 122 (an angle between a tangent line of the lower electrode 160 and a tangent line of the supporter pattern 122 at a point where the supporter pattern 122 and the lower electrode 160 meet) may be greater than 90°. Accordingly, the dielectric layer 162 may be more uniformly deposited in a process of forming the dielectric layer 162, which will be described later.

When viewed in a plan view, the dielectric layer 162 may be disposed inside the open hole OP of the second supporter structure 150. For example, when viewed in a plan view, the dielectric layer 162 may cover the side surfaces of the lower electrodes 160 and an inner wall 152-S of the supporter plate 152, which are exposed by the open hole OP. In some example embodiments, the lower electrode 160 exposed by the open hole OP and an inner wall of the open hole OP (e.g., inner wall 152-S of the supporter plate 152) may contact each other at an acute angle.

Since the open hole OP is surrounded by the supporter plate 152, whereas the supporter pattern 122 is surrounded by the open region 124, the open ratio of the first supporter structure 120 may be greater than the open ratio of the second supporter structure 150. Accordingly, the semiconductor device 100 according to the example embodiments of the inventive concepts may achieve an increase in open ratio because the semiconductor device 100 includes the first supporter structure 120, which includes the supporter pattern 122 and the open region 124. In addition, the semiconductor device 100 may achieve an enhancement in dispersion while securing reliability and productivity.

FIGS. 3A, 3B, 4A, 4B, 5A, 5B, 6A, 6B, 7A, 7B, 8A, 8B, 9A, 9B, 10A, 10B, 11, 12, 13, 14, and 15 are plan views and vertical cross-sectional views illustrating in process order of a method of manufacturing a semiconductor device according to some example embodiments of the inventive concepts. Specifically, FIGS. 3A, 4A, 5A, 6A, 7A, 8A, 9A, and 10A are plan views corresponding to FIG. 1A, and FIGS. 3B, 4B, 5B, 6B, 7B, 8B, 9B, and 10B are vertical cross-sectional views taken along lines I-I' in FIGS. 3A, 4A, 5A, 6A, 7A, 8A, 9A, and 10A, respectively. FIGS. 11 to 15 are vertical cross-sectional views.

Figure 3A:
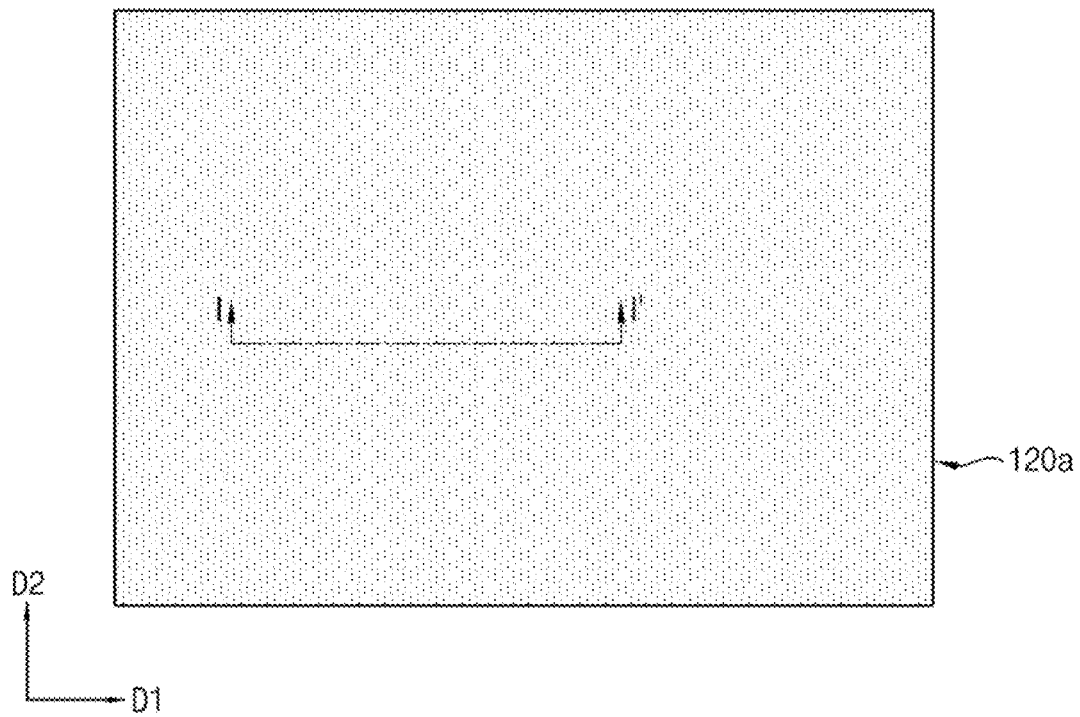
FIGS. 3A, 3B, 4A, 4B, 5A, 5B, 6A, 6B, 7A, 7B, 8A, 8B, 9A, 9B, 10A, 10B, 11, 12, 13, 14, and 15 are plan views and vertical cross-sectional views illustrating in process order of a method of manufacturing a semiconductor device according to some example embodiments of the inventive concepts.
Figure 3B:
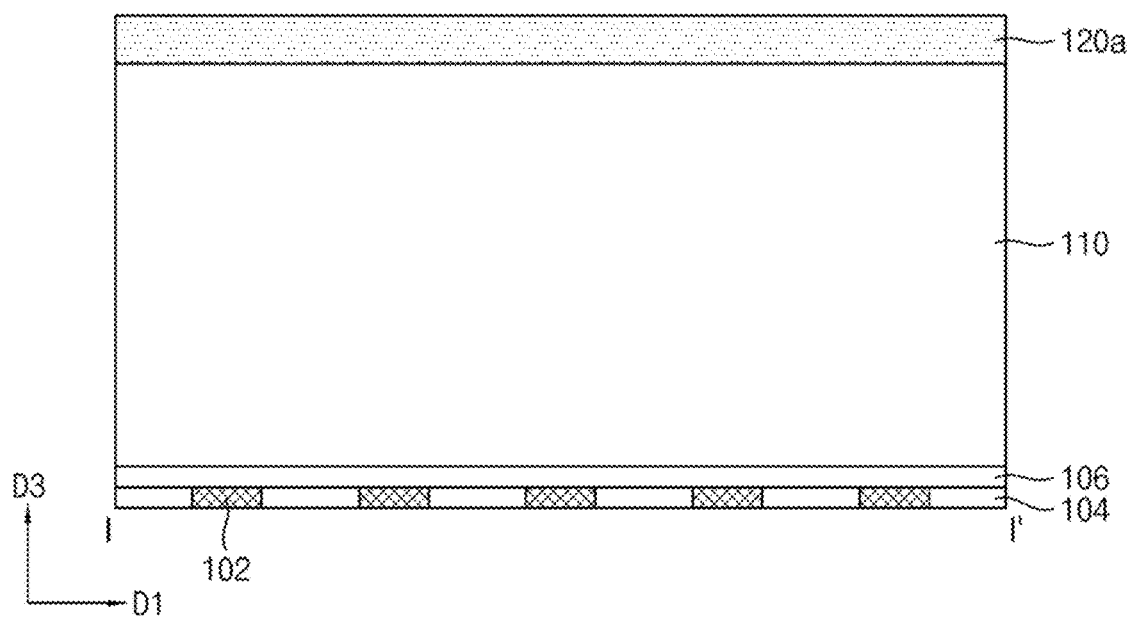

Referring to FIGS. 3A and 3B, a landing pad 102 and an insulating structure 104 may be provided. The insulating structure 104 may be disposed among landing pads 102. The landing pad 102 may include a conductive material. For example, the landing pad 102 may include a doped semiconductor material such as doped polysilicon, a metal-semiconductor compound such as $WSi_2$, a metal nitride such as TiN or TaN, or a metal such as Ti, W, or Ta. The insulating structure 104 may include silicon oxide, silicon nitride, silicon oxynitride, or a combination thereof.

An etch stop layer 106, a first mold layer 110, and a first supporter layer 120a may be sequentially stacked on the landing pad 102 and the insulating structure 104. The etch stop layer 106 may cover the landing pad 102 and the insulating structure 104.

The etch stop layer 106 may include a material having etch selectivity with respect to the first mold layer 110. In some example embodiments, the etch stop layer 106 may include silicon nitride. The first mold layer 110 may include a material having etch selectivity with respect to the first supporter layer 120a. For example, the first mold layer 110 may include silicon oxide, and the first supporter layer 120a may include silicon nitride.

Figure 4A:
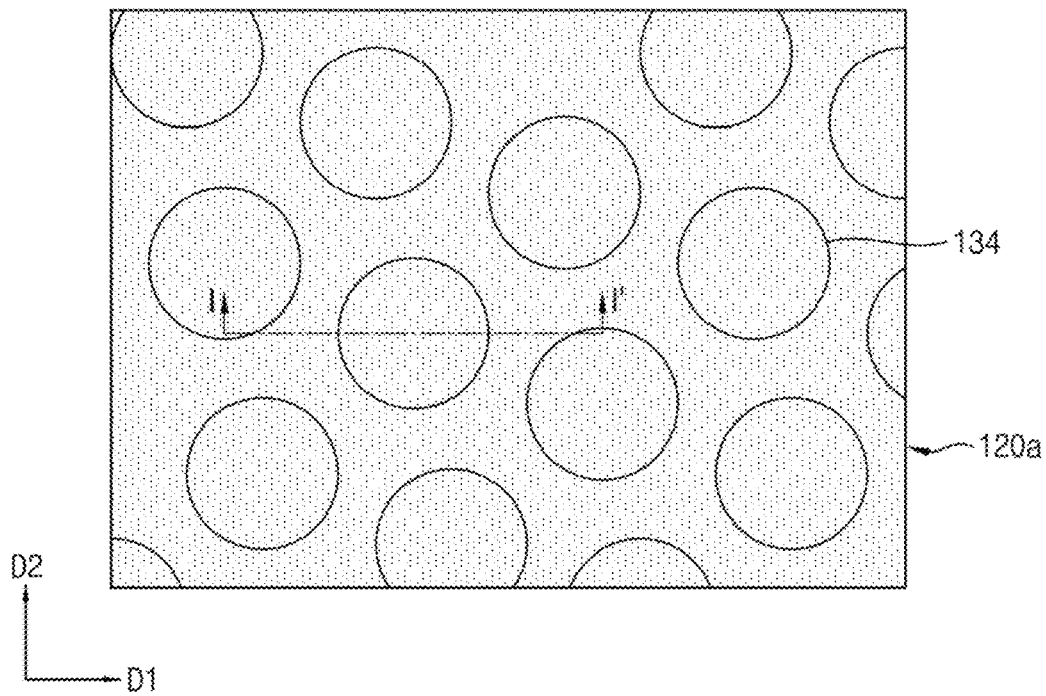
Figure 4B:
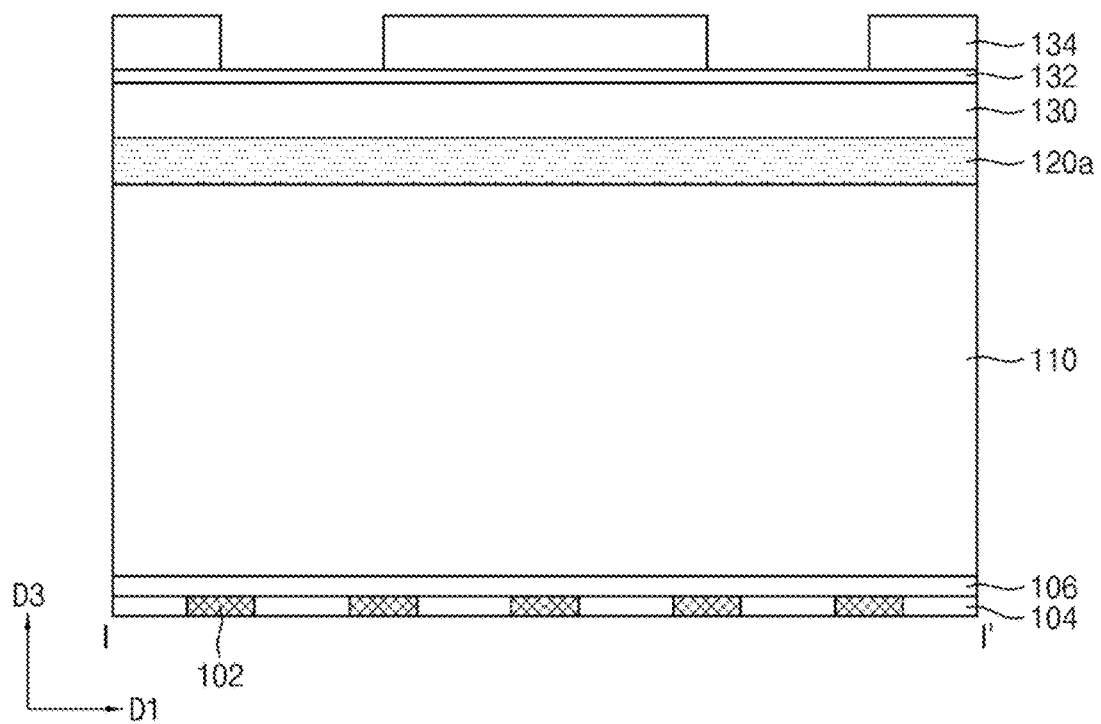

Referring to FIGS. 4A and 4B, a mask layer 130, an etch stop layer 132, and a photoresist 134 may be stacked on the first supporter layer 120a. The mask layer 130 may completely cover the first supporter layer 120a, and the etch stop layer 132 may completely cover the mask layer 130. The photoresist 134 may expose a portion of the etch stop layer 132. For example, the photoresist 134 may be patterned to include circular structures disposed to be spaced apart from one another by a uniform distance (e.g., a fixed distance). The circular structures may be disposed in the form of a honeycomb structure, and the photoresist 134 may define a region where a supporter pattern 122 to be described later will be disposed. The etch stop layer 132 may prevent the mask layer 130 from being etched upon patterning of the photoresist 134. In some example embodiments, the mask layer 130 may include an amorphous carbon layer (ACL), and the etch stop layer 132 may include SiON.

Figure 5A:
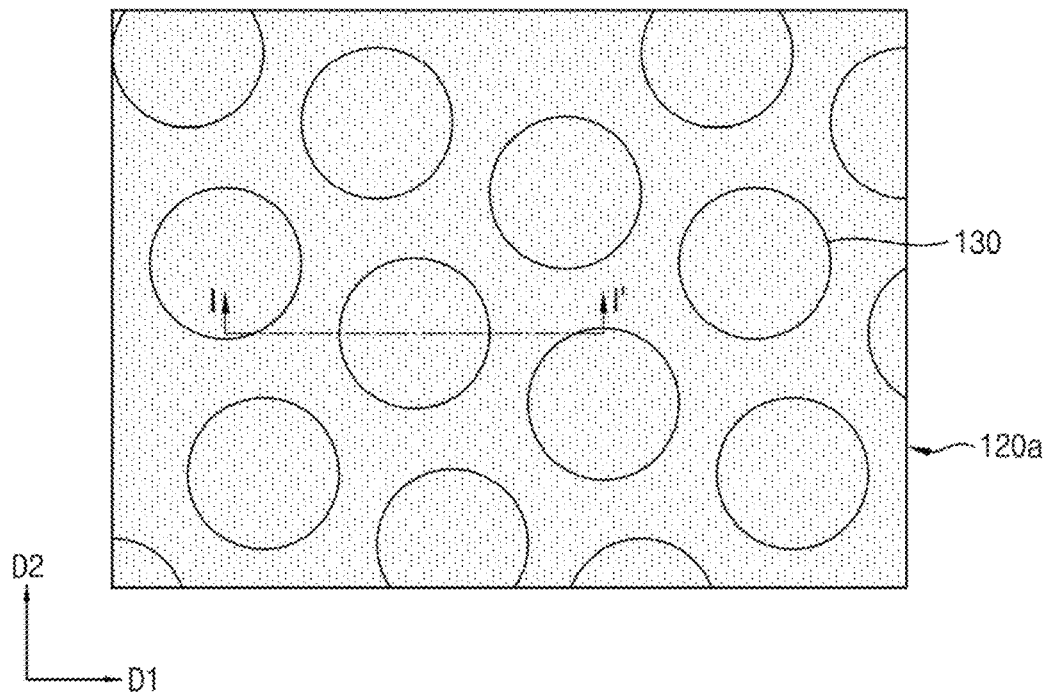
Figure 5B:
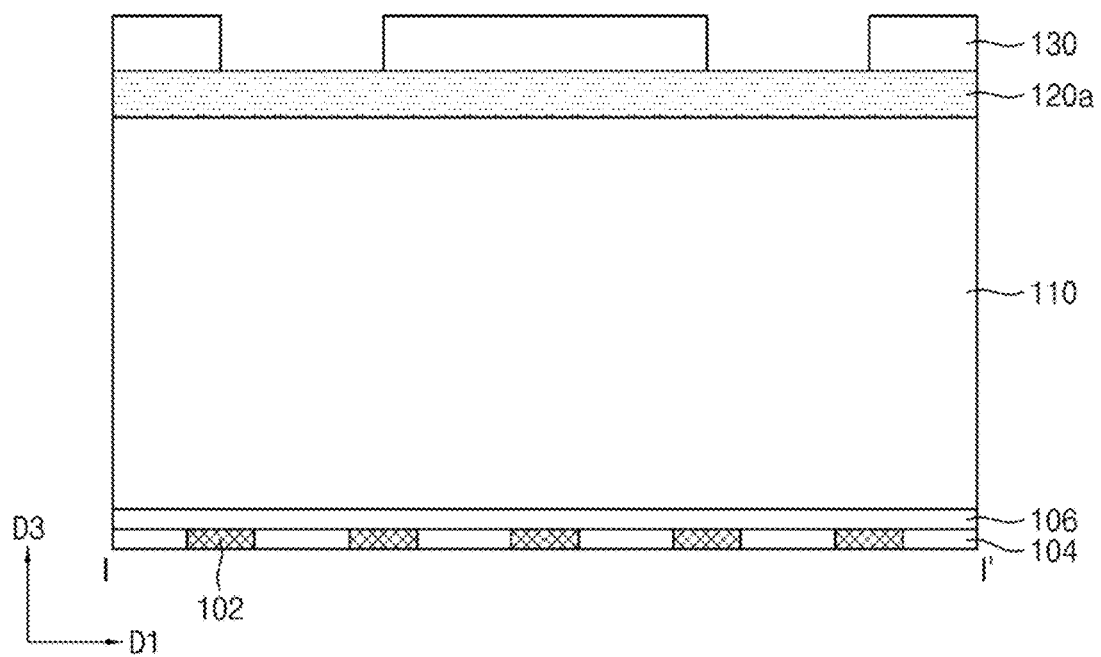

Referring to FIGS. 5A and 5B, the mask layer 130 may be patterned by an anisotropic etching process using the photoresist 134 as an etch mask. The patterned mask layer 130 may expose a portion of the first supporter layer 120a. For example, the mask layer 130 may be patterned to include circular structures disposed to be spaced apart from one another by a uniform distance. After patterning of the mask layer 130, the etch stop layer 132 and the photoresist 134 on the mask layer 130 may be removed.

Figure 6A:
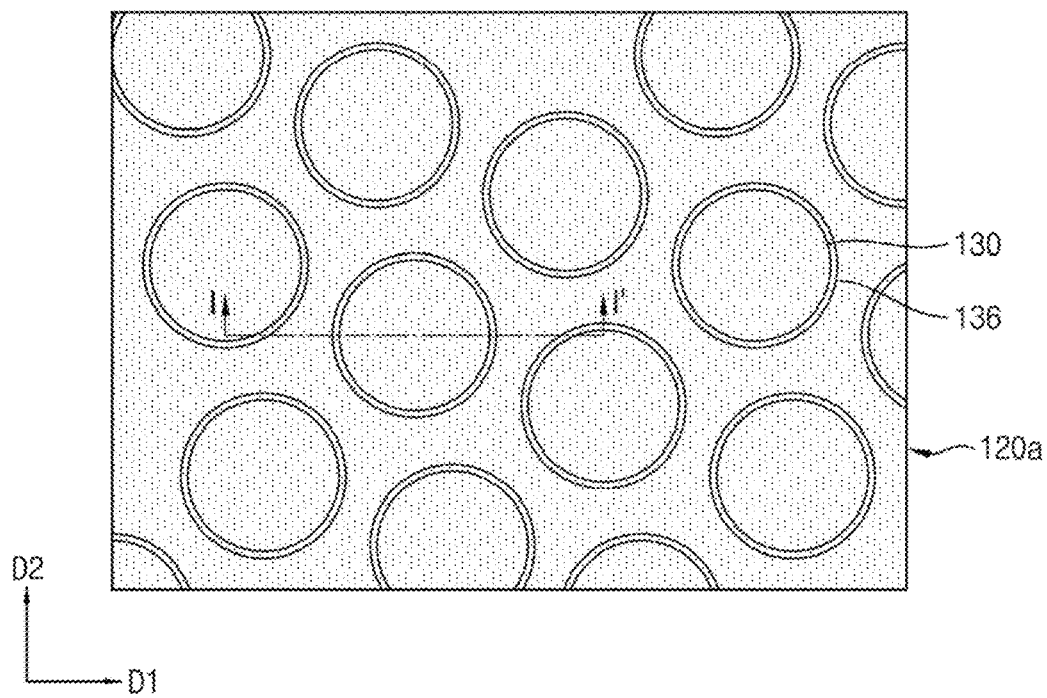
Figure 6B:
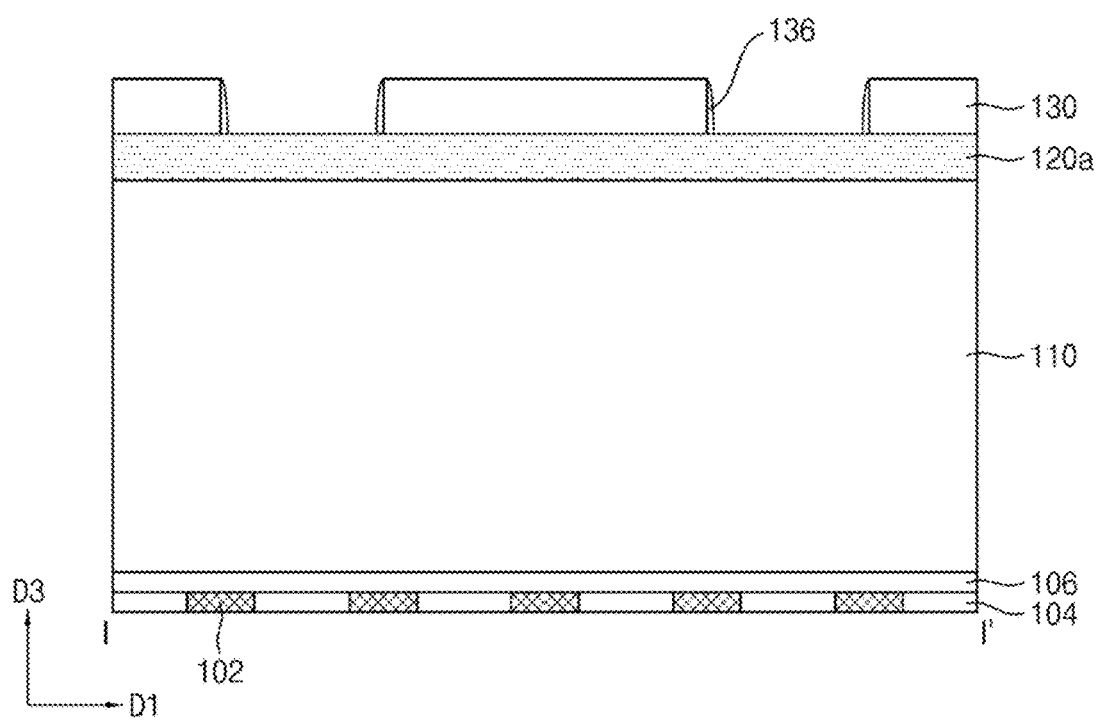

Referring to FIGS. 6A and 6B, a mask spacer 136 may be formed. The mask spacer 136 may be formed by conformally depositing a sacrificial material on the resultant structure of FIGS. 6A and 6B, and then anisotropically etching the sacrificial material. For example, the mask spacer 136 may be disposed on the first supporter layer 120a exposed by the mask layer 130, and may be disposed at a side surface of the mask layer 130. In some example embodiments, the mask spacer 136 may include silicon oxide, silicon nitride, or silicon oxynitride. For example, the mask spacer 136 may include silicon oxide. The process of forming the mask spacer 136 may be optional and, as such, may be omitted in some embodiments.

Figure 7A:
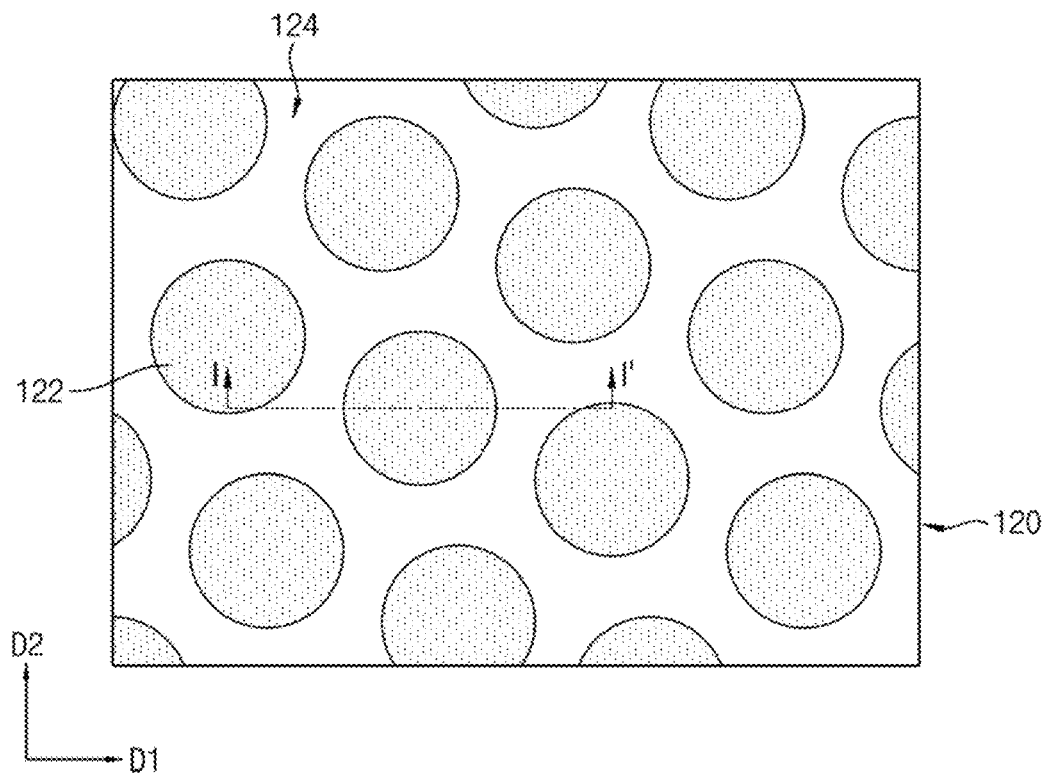
Figure 7B:
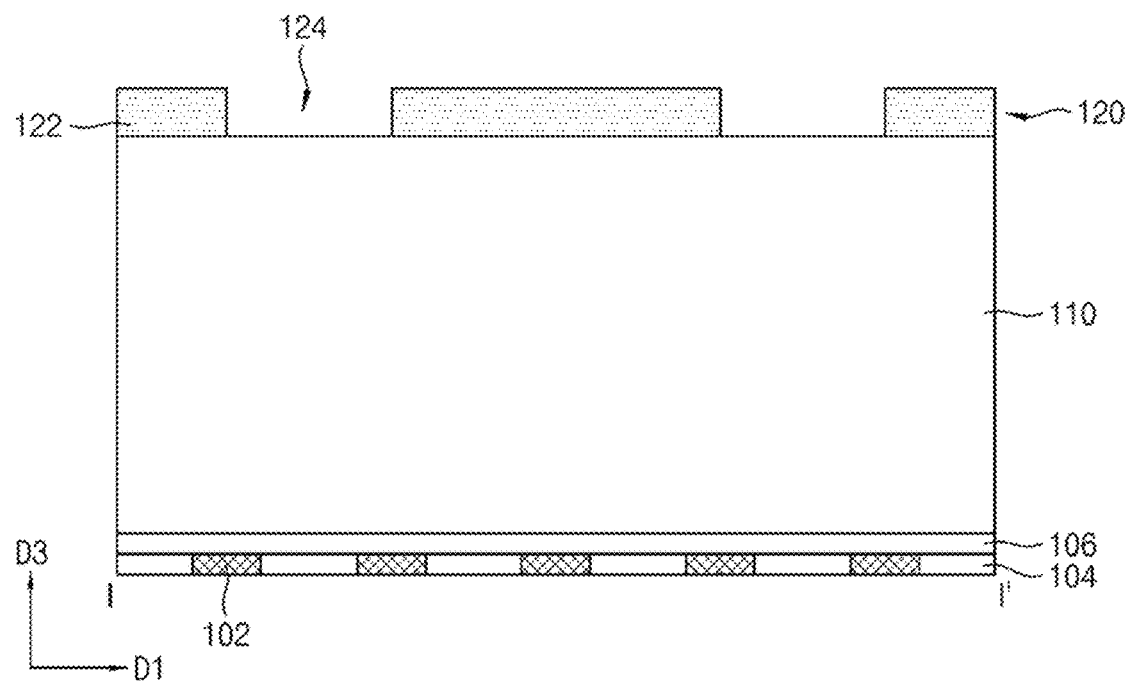

Referring to FIGS. 7A and 7B, the first supporter layer 120a may be pattern by an anisotropic etching process using the mask layer 130 and the mask spacer 136 as an etch mask, thereby forming a first supporter structure 120. The first supporter structure 120 may expose a portion of the first mold layer 110. For example, the first supporter structure 120 may be patterned to include circular supporter patterns 122 disposed to be spaced apart from one another by a uniform distance. The first supporter structure 120 may also include an open region 124 among the supporter patterns 122. The open region 124 may mean a space among the supporter patterns 122, and the supporter patterns 122 may surrounded by the open region 124. After completion of the patterning process, the mask layer 130 and the mask spacer 136 on the first supporter layer 120a may be removed.

Figure 8A:
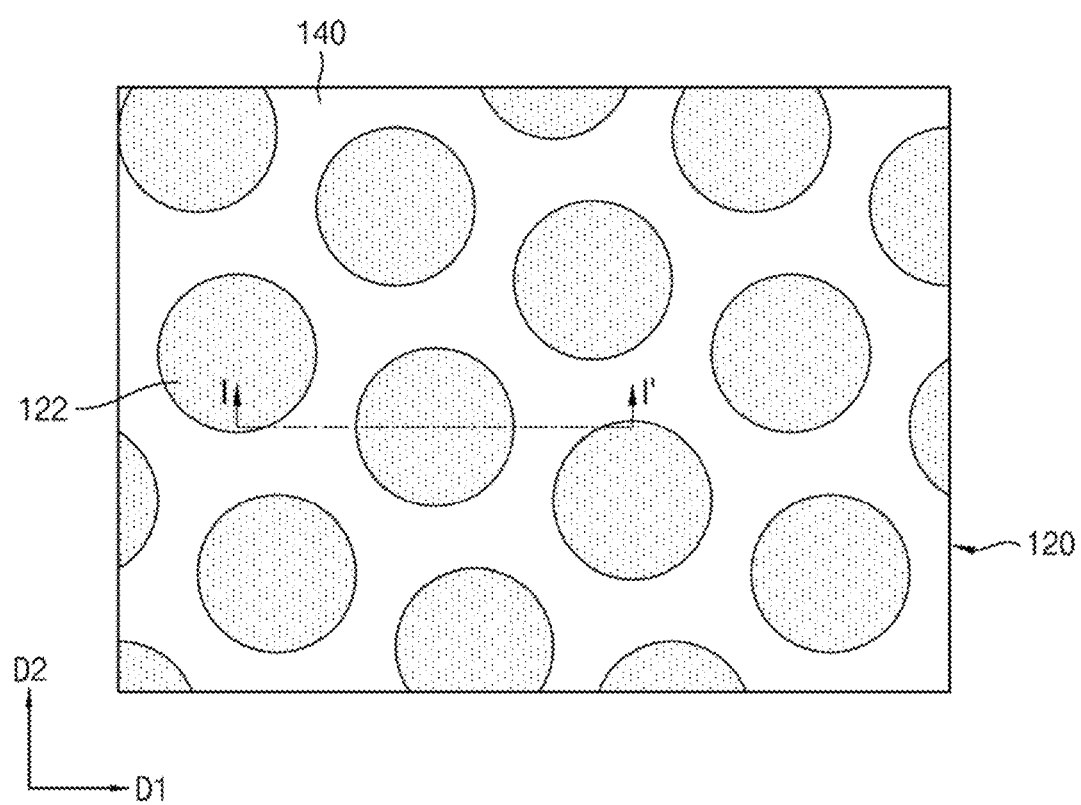
Figure 8B:
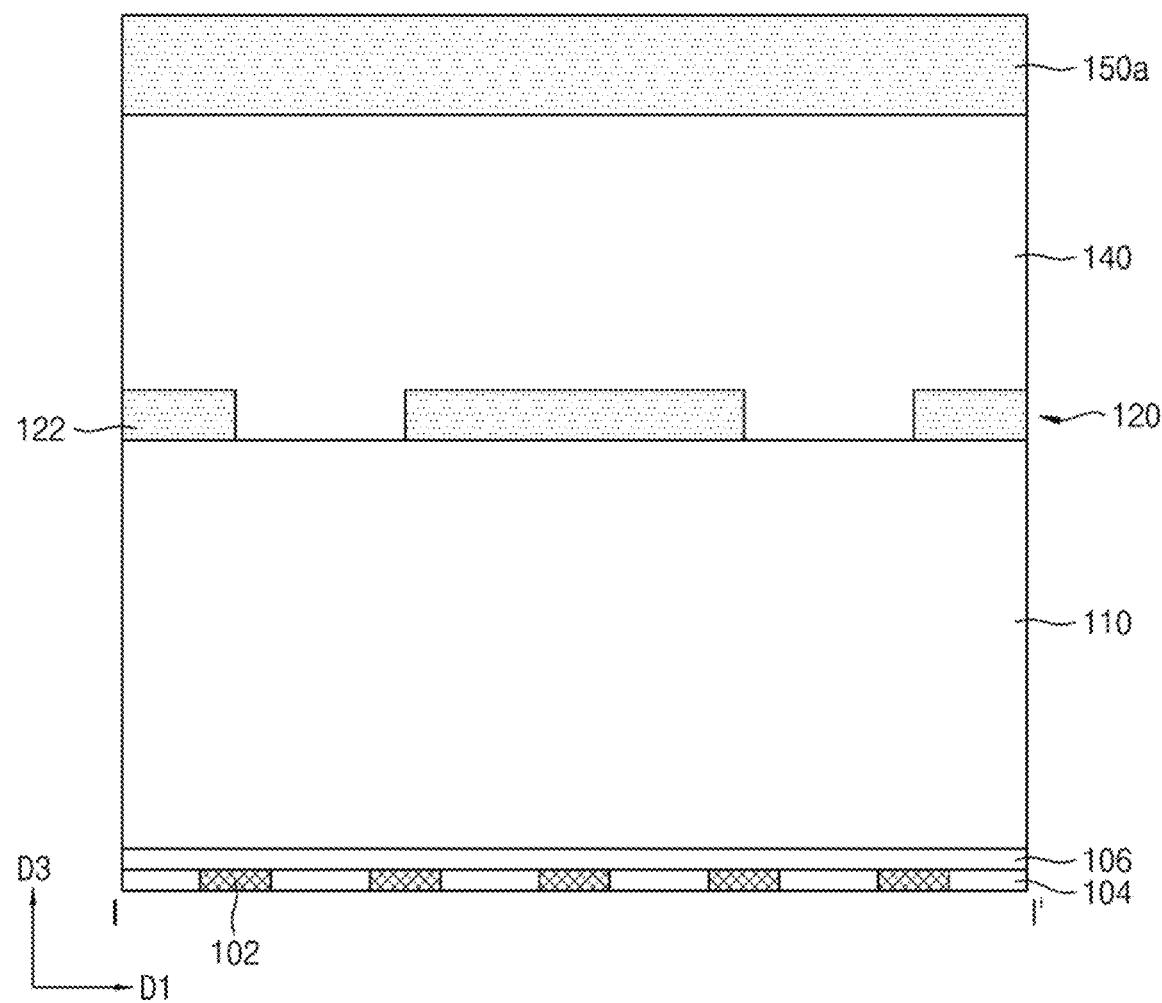

Referring to FIGS. 8A and 8B, a second mold layer 140 and a second supporter layer 150a may be deposited on the resultant structure of FIGS. 7A and 7B. The second mold layer 140 may cover the supporter pattern 122. For example, the second mold layer 140 may be disposed at an upper surface of the supporter pattern 122, and may fill the open region 124. The second supporter layer 150a may be disposed on the second mold layer 140. The thickness of the second supporter layer 150a may be greater than the thickness of the first supporter structure 120. The second mold layer 140 may include a material having etch selectivity with respect to the second supporter layer 150a. For example, the second mold layer 140 may include silicon oxide, and the second supporter layer 150a may include silicon nitride.

Figure 9A:
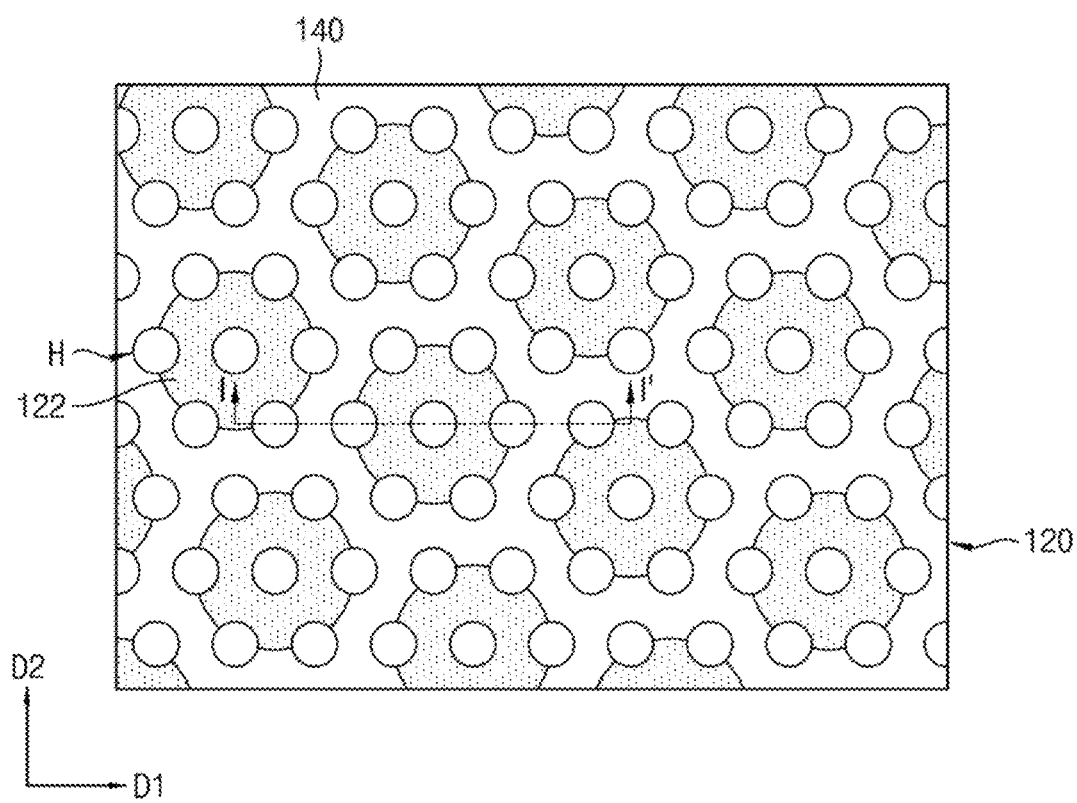
Figure 9B:
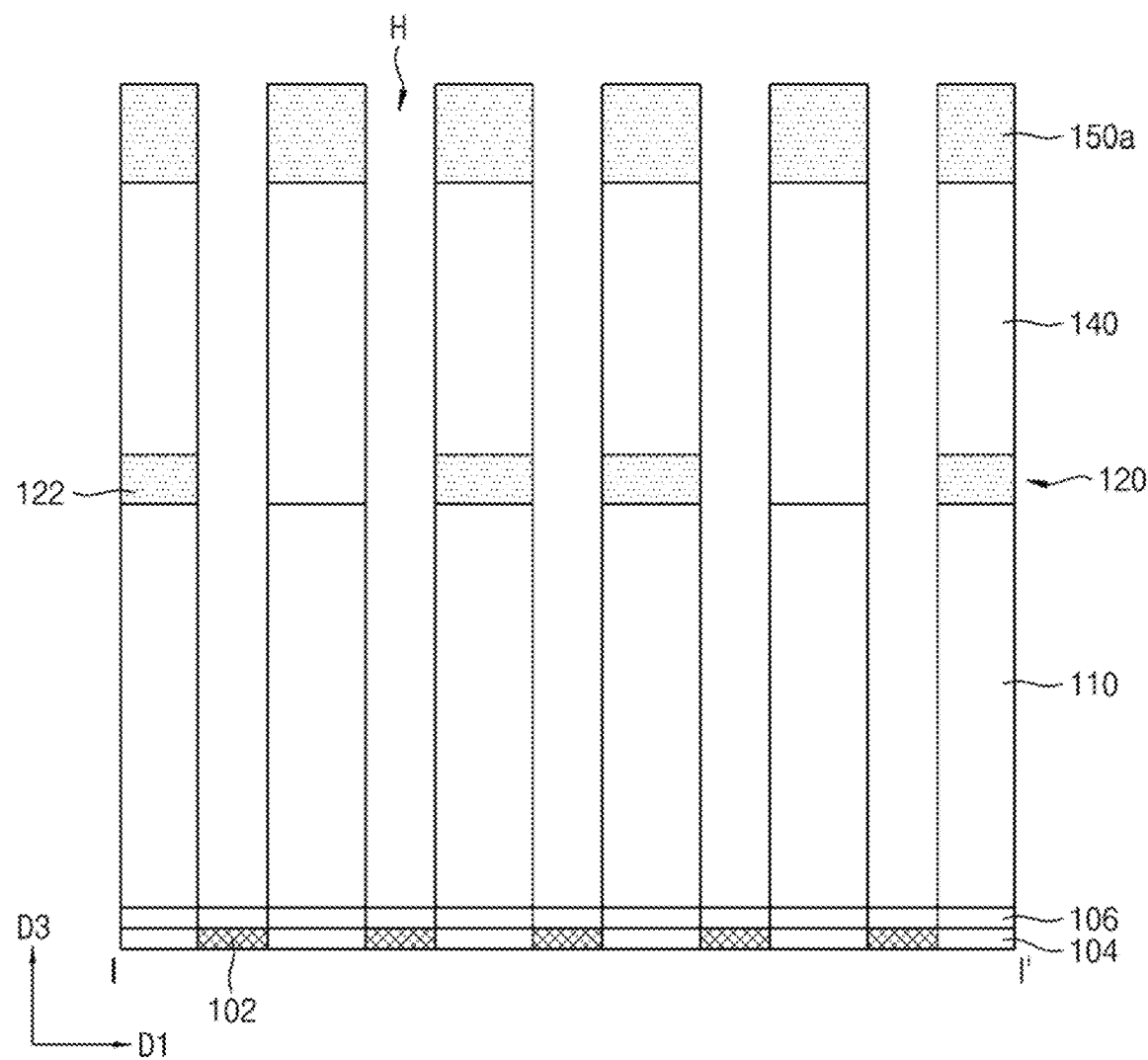

Referring to FIGS. 9A and 9B, a through hole H may be formed to vertically extend through the etch stop layer 106, the first mold layer 110, the first supporter layer 120a, the second mold layer 140, and the second supporter layer 150a.

The through hole H may have a uniform horizontal width, and, in some embodiments, the through hole H may have a tapered shape in which the through hole H has a horizontal width gradually decreasing as the through hole H extends downwards. The through hole H may be formed by a dry etching process, and, for example, the second supporter layer 150a, the second mold layer 140, the first supporter layer 120a, and the first mold layer 110 may be sequentially anisotropically etched, and the etch stop layer 106 may then be removed at a portion thereof such that the landing pad 102 is exposed.

Figure 10A:
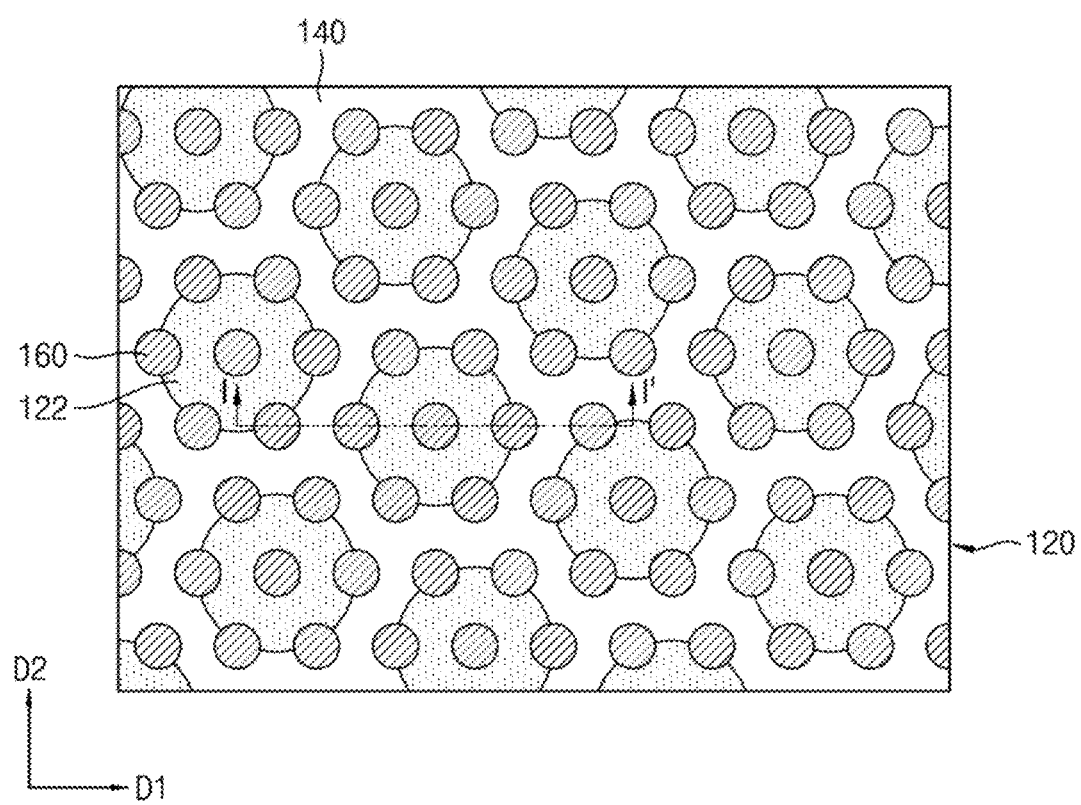
Figure 10B:
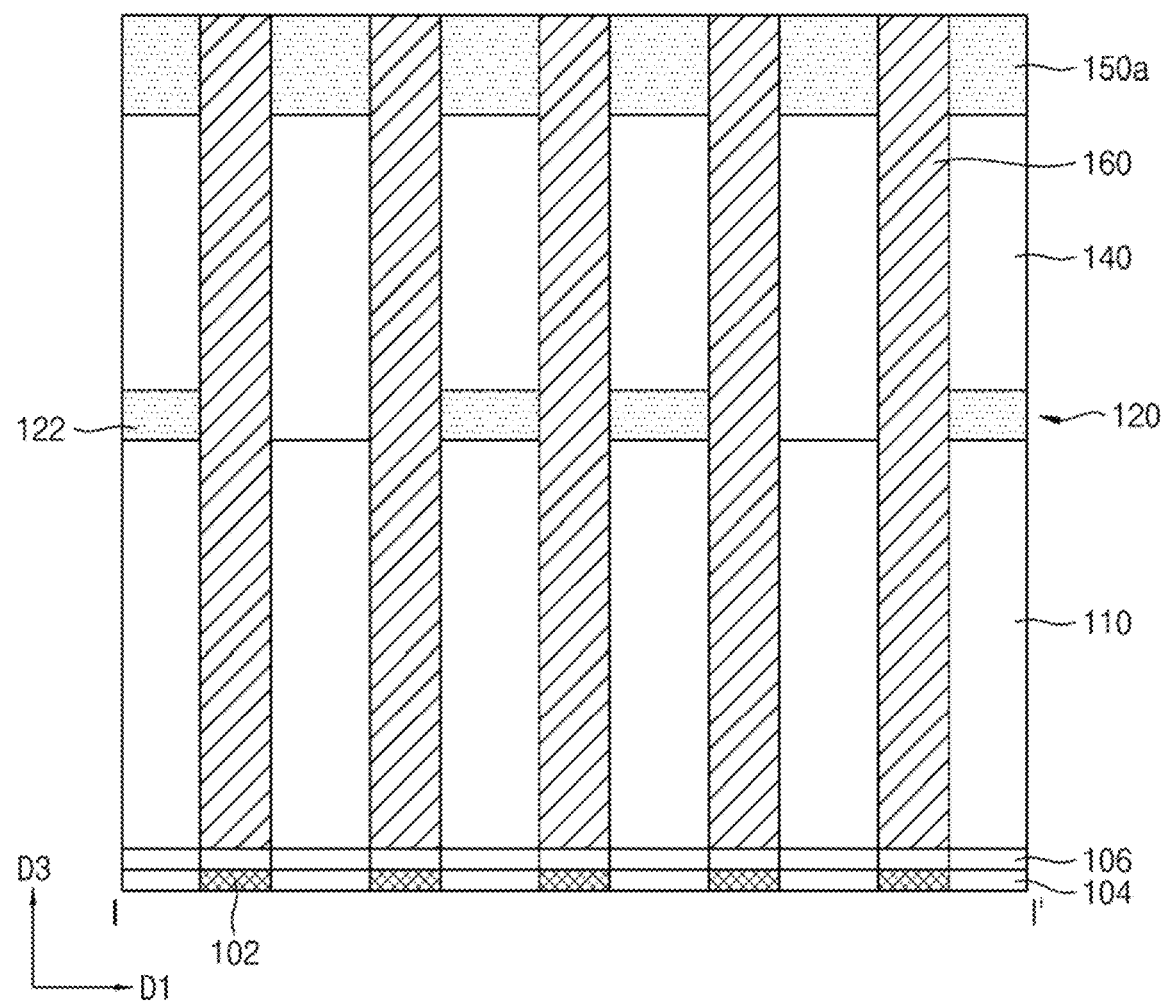

Referring to FIGS. 10A and 10B, a lower electrode 160 may be formed in the through hole H. The lower electrode 160 may be formed through a process such as chemical vapor deposition (CVD), atomic layer deposition (ALD), plasma enhanced ALD (PEALD), etc. The lower electrode 160 may include a metal such as Ti, W, Ni, and Co, or a metal nitride such as TiN, TiSiN, TiAlN, TaN, TaSiN, WN, etc. After formation of the lower electrode 160, a planarization process may be performed.

When viewed in a plan view, lower electrodes 160 may be disposed to be spaced apart from one another by a uniform distance. In some example embodiments, the lower electrodes 160 may have a honeycomb structure in which the lower electrodes 160 are disposed at a center of a hexagon and vertexes of the hexagon, respectively. In some example embodiments, the lower electrode 160 may have a pillar shape, without being limited thereto. In some embodiments, the lower electrode 160 may have a cylindrical shape or a hybrid shape that is a combination of a pillar shape and a cylindrical shape.

The lower electrodes 160 may extend through the supporter patterns 122, and, when viewed in a plan view, the lower electrodes 160 may contact the supporter patterns 122. The supporter patterns 122 may be disposed to be spaced apart from one another under the condition that the open region 124 is interposed thereamong. In some example embodiments, each supporter pattern 122 may contact side surfaces of seven lower electrodes 160. For example, six lower electrodes 160 may partially contact each supporter pattern 122, and one lower electrode 160 may be surrounded by the supporter pattern 122. That is, six lower electrodes 160 may be disposed along a circumference of the supporter pattern 122, and one lower electrode 160 may be disposed at a center of the supporter pattern 122. The six lower electrodes 160 disposed at the circumference of the supporter pattern 122 may be exposed to the open region 124.

The distance 122d between the supporter patterns 122 adjacent to each other (e.g., a distance 122d between adjacent ones of the supporter patterns 122) may be smaller than or equal to the pitch 160p of the lower electrodes 160. For example, the distance between the side surfaces of the adjacent supporter patterns 122 or the horizontal width of the open region 124 between the side surfaces of the adjacent supporter patterns 122 may be smaller than or equal to the distance between the centers of the adjacent lower electrodes 160.

Figure 11:
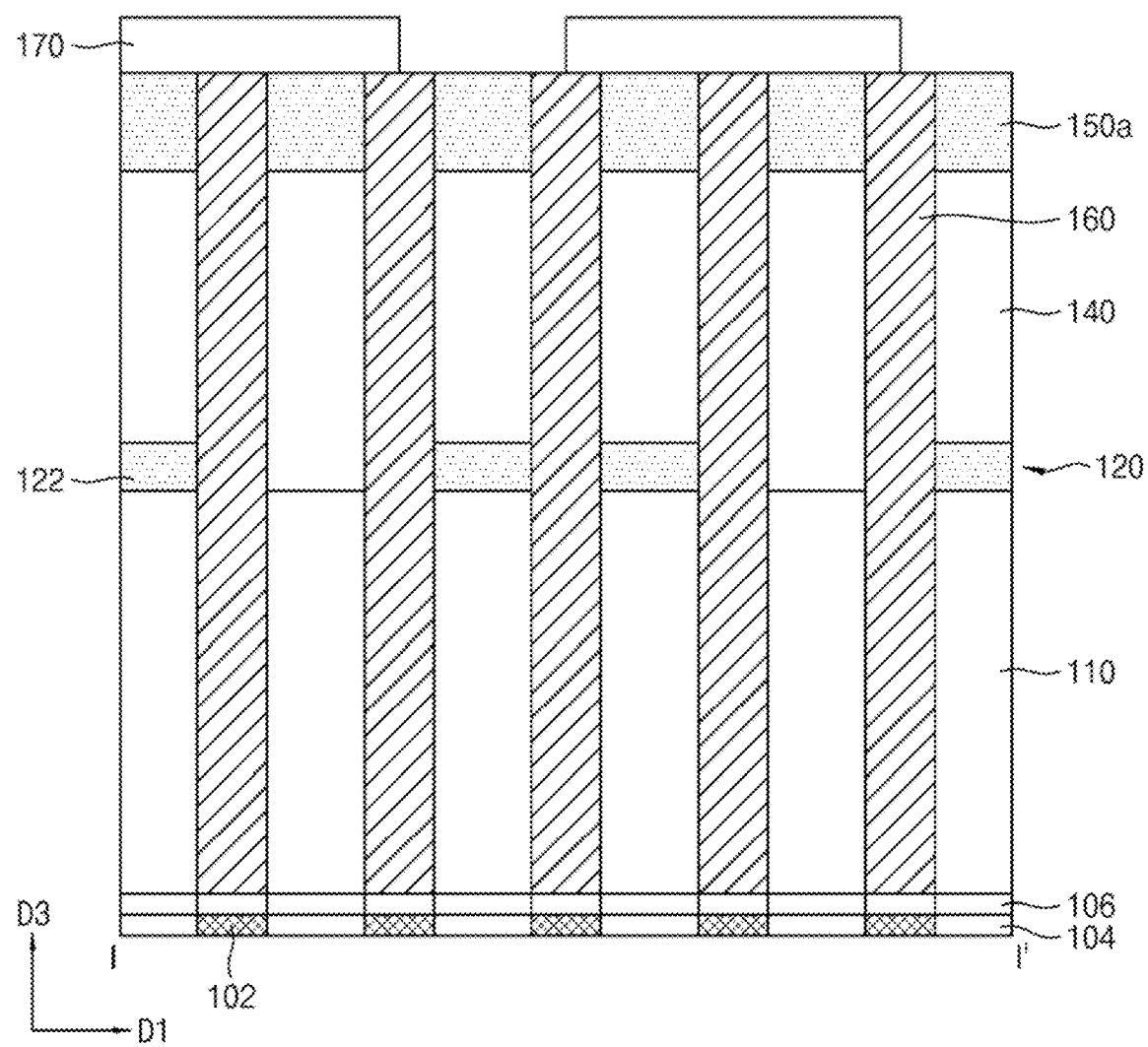

Referring to FIG. 11, a mask layer 170 may be formed on the second supporter layer 150a and the lower electrode 160. The mask layer 170 may be patterned to expose a portion of the second supporter layer 150a. In some example embodiments, the mask layer 170 may include an ACL.

Figure 12:
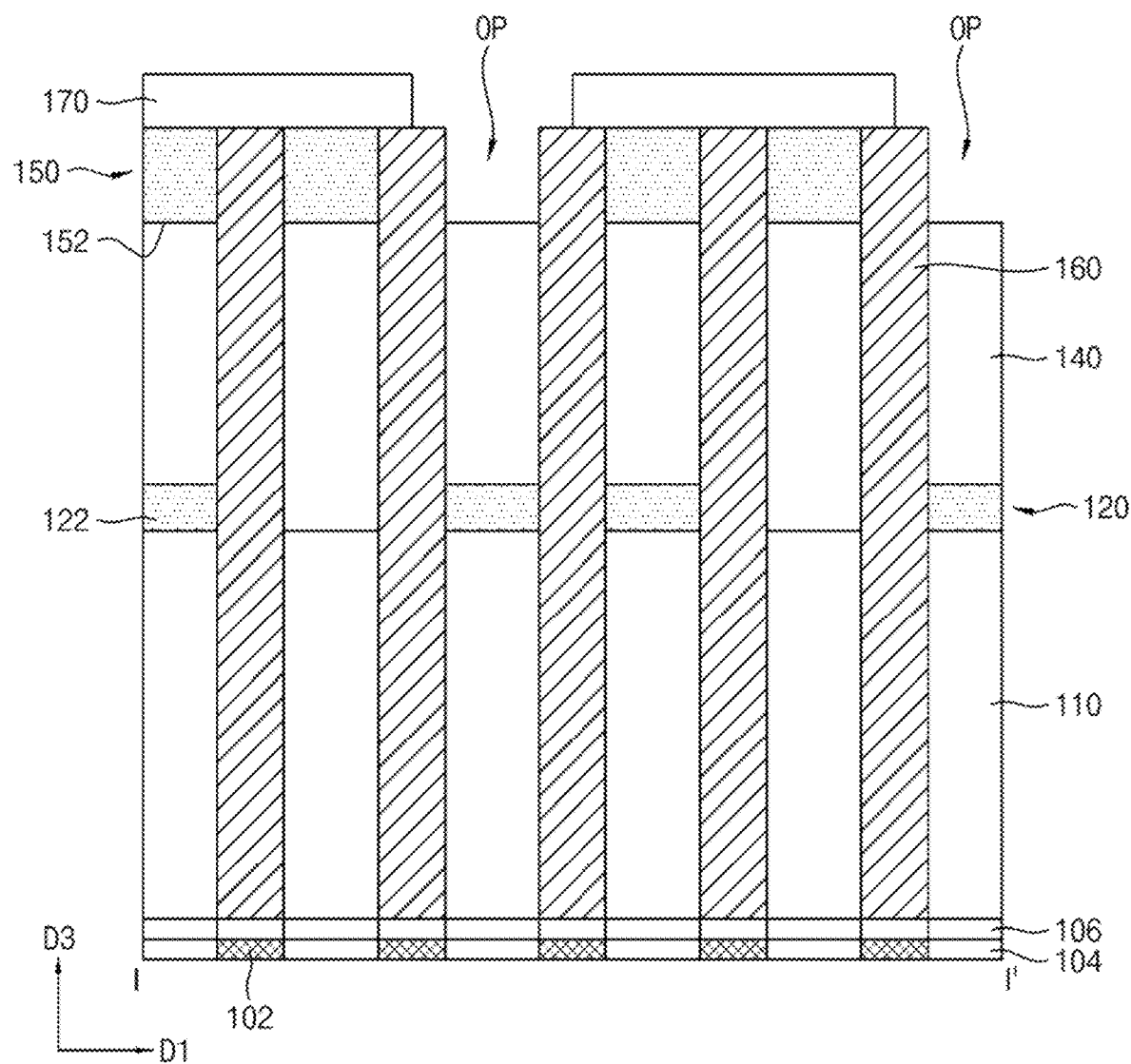

Referring to FIG. 12, the portion of the second supporter layer 150a exposed by the mask layer 170 may be removed by an anisotropic etching process. As the second supporter layer 150a is patterned by the etching process, a second supporter structure 150 may be formed. The second supporter structure 150 may include a plate-shaped supporter plate 152, and open holes OP formed inside of the supporter plate 152. The open holes OP may be disposed among the lower electrodes 160 adjacent to one another.

Figure 13:
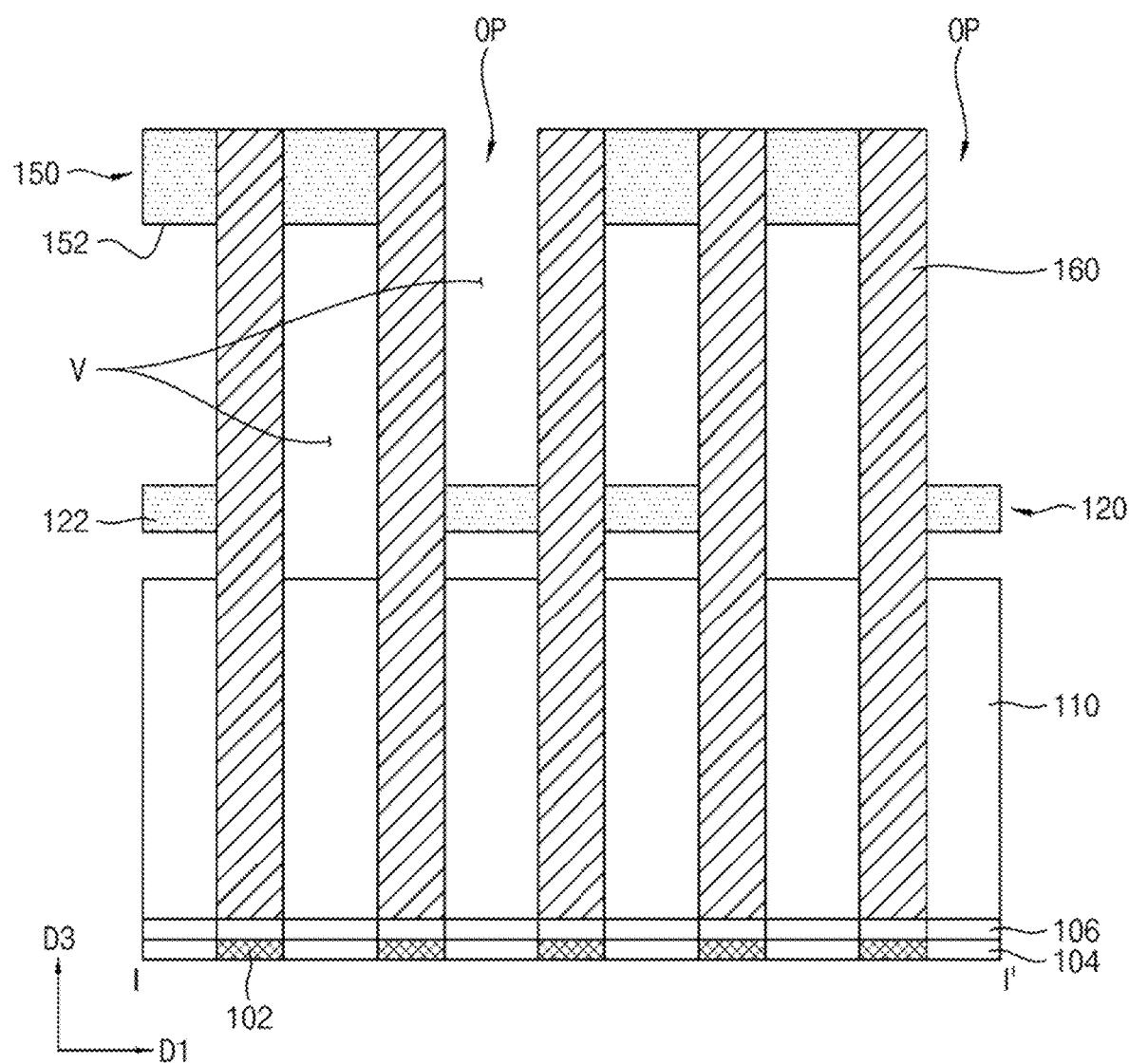

Referring to FIG. 13, the second mold layer 140 and the mask layer 170 may be removed. First, the second mold layer 140 may be selectively removed by an isotropic etching process. The first supporter structure 120, the second supporter structure 150, and the lower electrode 160, which have etch selectivity with respect to the second mold layer 140, may not be removed. In the process of removing the second mold layer 140, the first mold layer 110 may be partially removed and, as such, a bottom surface of the first supporter structure 120 may be exposed. As the second mold layer 140 is removed, a void V may be formed among the lower electrodes 160 and between the first supporter structure 120 and the second supporter structure 150.

After removal of the second mold layer 140, the mask layer 170 may be removed. For example, the mask layer 170 may be removed by an ashing process. In the process of removing the mask layer 170, the first supporter structure 120 may be partially etched. For example, a side surface of the supporter pattern 122 exposed by the open region 124 may be partially oxidized in the ashing process, and may then be partially removed during removal of the mask layer 170. Accordingly, the side surface 122-S of the supporter pattern 122 may be formed to be concave, as shown in FIG. 1A.

Figure 14:
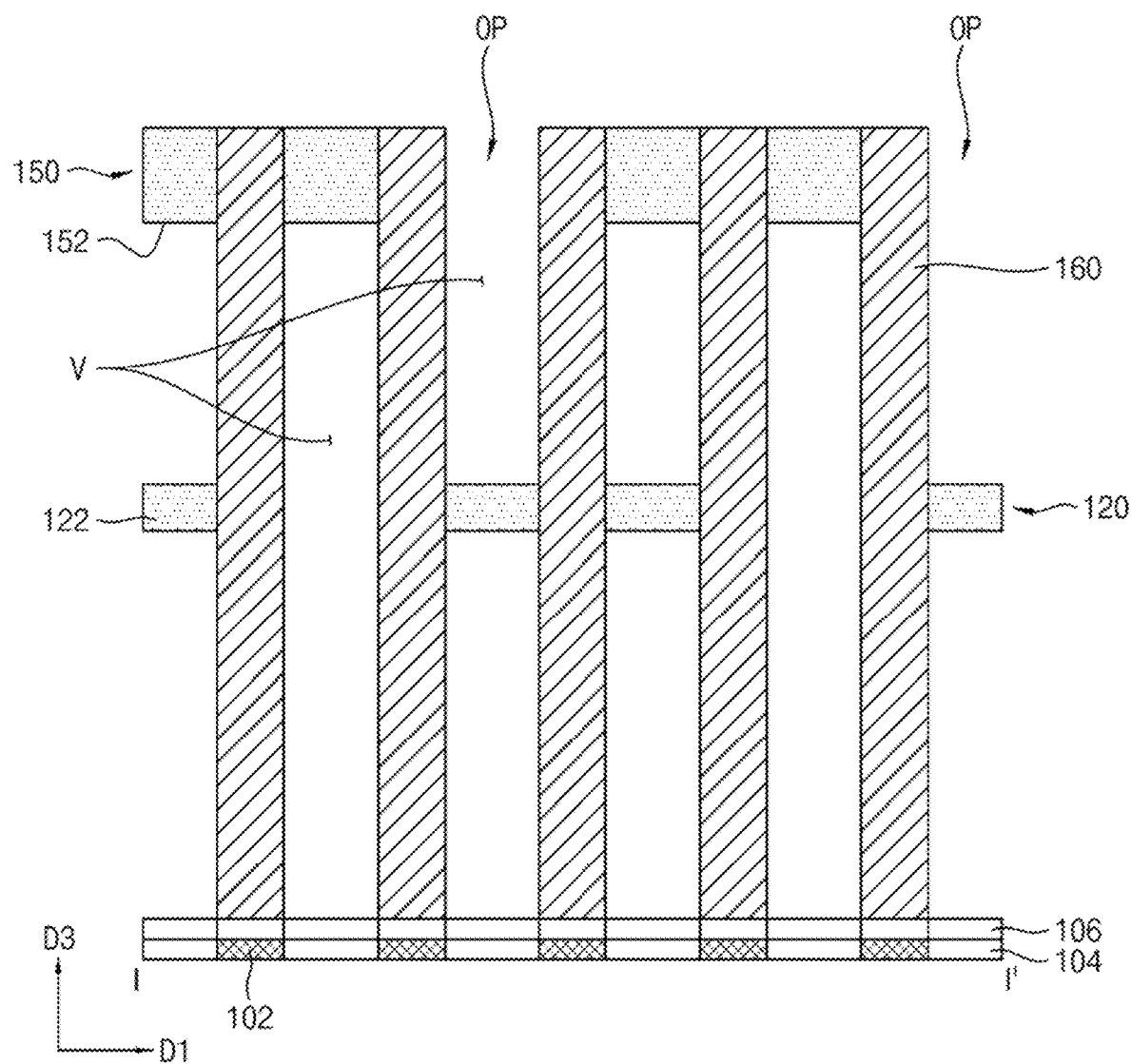

Referring to FIG. 14, the first mold layer 110 may be selectively removed by an isotropic etching process. The first supporter structure 120, the second supporter structure 150, and the lower electrode 160, which have etch selectivity with respect to the first mold layer 110, may not be etched. Upper surfaces and bottom surfaces of the first supporter structure 120 and the second supporter structure 150 may be exposed by the void V.

Figure 15:
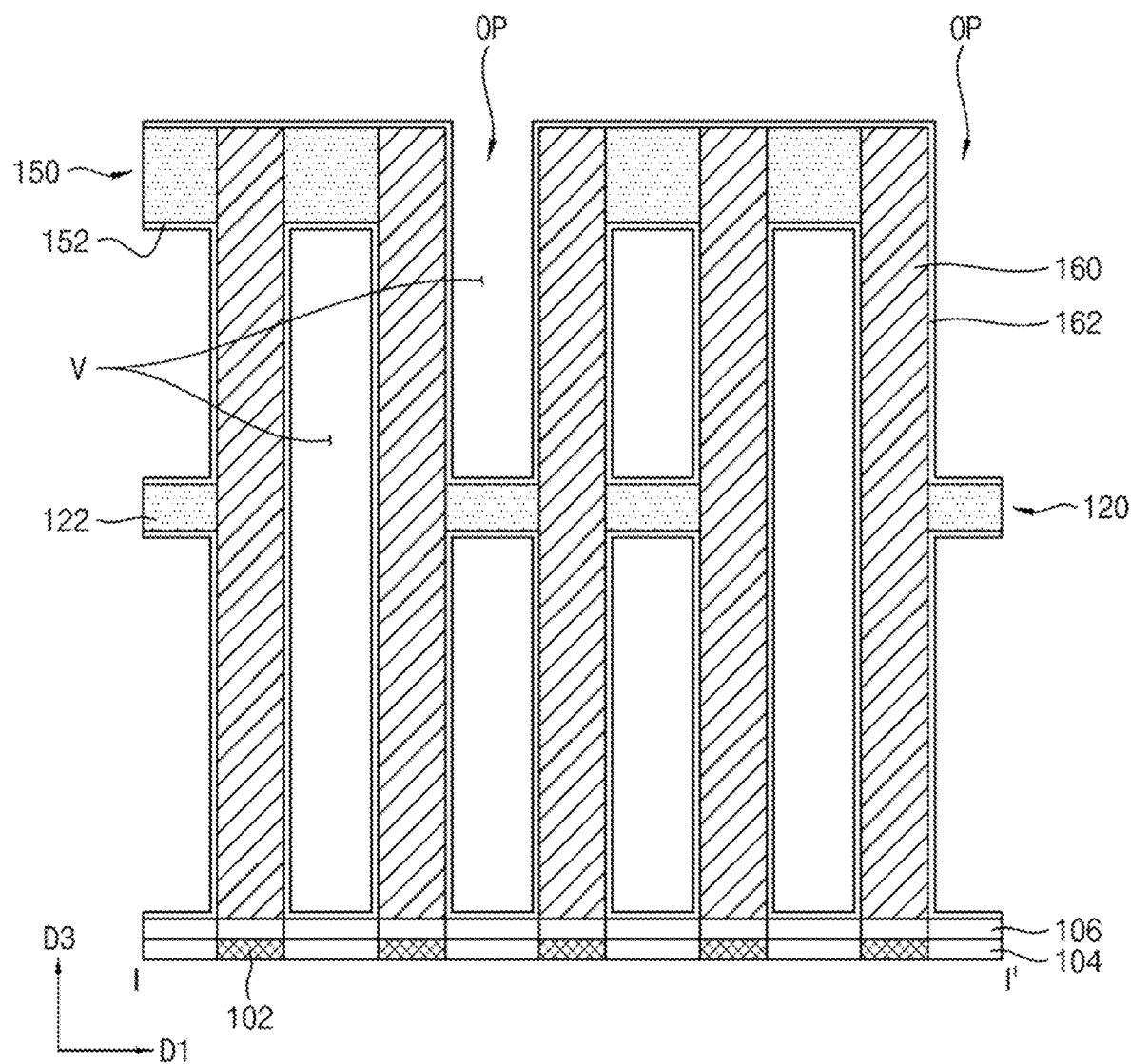

Referring to FIG. 15, a dielectric layer 162 may be disposed on the resultant structure of FIG. 14. The dielectric layer 162 may be conformally formed along surfaces of the etch stop layer 106, the lower electrode 160, the first supporter structure 120, and the second supporter structure 150. The dielectric layer 162 may include a metal oxide such as $HfO_2$, $ZrO_2$, $Al_2O_3$, $La_2O_3$, $Ta_2O_3$, and $TiO_2$, a dielectric material having a perovskite structure such as $SrTiO_3$(STO), $BaTiO_3$, PZT and PLZT, or a combination thereof. The dielectric layer 162 may be formed through a process such as CVD, ALD, etc.

Again referring to FIGS. 1A to 1C, an upper electrode 164 may be formed on the dielectric layer 162 and, as such, a semiconductor device 100 may be formed. The upper electrode 164 may fill the void V, and may cover the lower electrodes 160. In addition, the upper electrode 164 may fill the open region 124 of the first supporter structure 120 and the opening hole OP of the second supporter structure 150.

As described above, the first supporter structure 120 may have the supporter patterns 122 surrounded by the open region 124 and, as such, may have a greater open ratio than the second supporter structure 150. Accordingly, the dielectric layer 162 and the upper electrode 164 may be more uniformly deposited.

Figure 16:
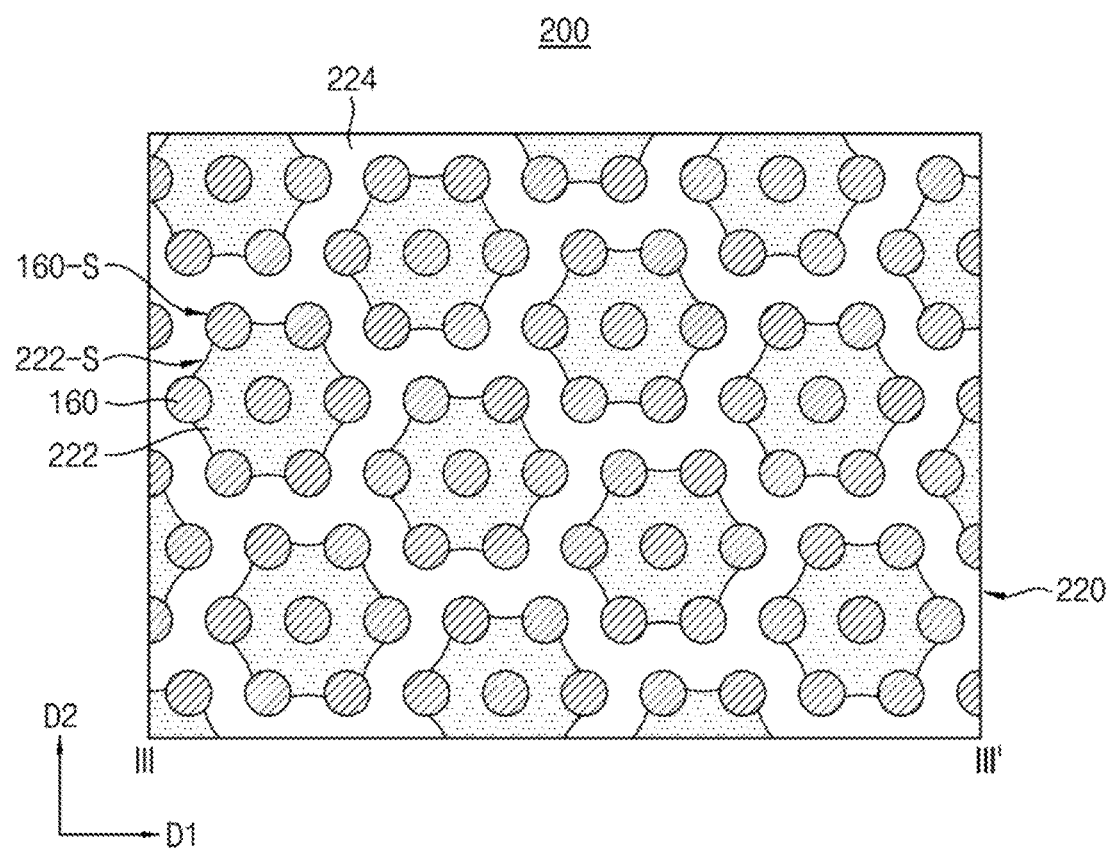
FIG. 16 is a plan view of a semiconductor device according to some example embodiments of the inventive concepts.
Figure 17:
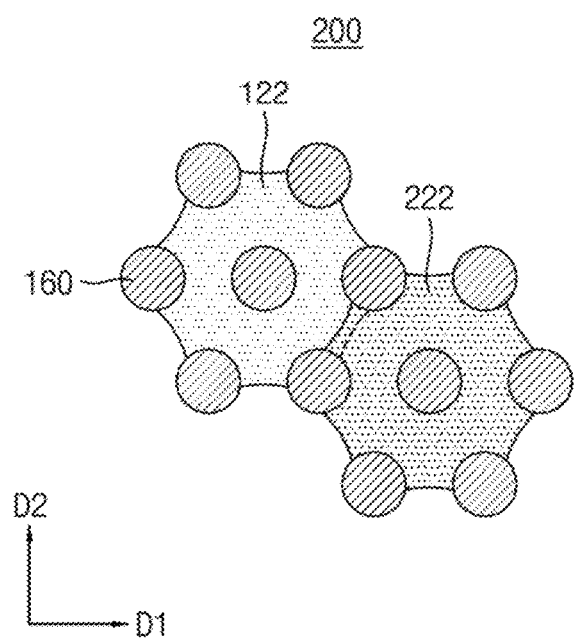
FIGS. 17 and 18 are plan views of supporter structures according to example embodiments of the inventive concepts.
Figure 18:
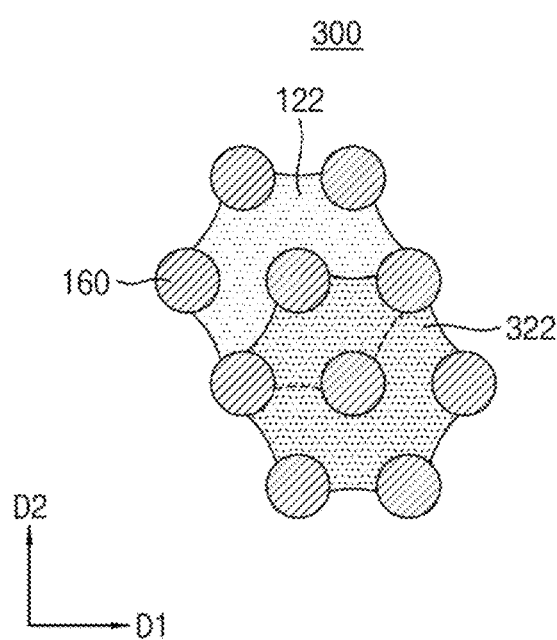

FIG. 16 is a plan view of a semiconductor device according to example embodiments of the inventive concepts. FIGS. 17 and 18 are plan views of supporter structures according to example embodiments of the inventive concepts. FIG. 17 is a plan view of a first supporter structure 120 and a second supporter structure 150 in the semiconductor device shown in FIG. 16.

Referring to FIGS. 16 and 17, a semiconductor device 200 may include a second supporter structure 220 supporting lower electrodes 160. In some example embodiments, the second supporter structure 220 may include supporter patterns 222 (also referred to herein as second supporter patterns) disposed to be spaced apart from one another by a uniform distance, and an open region 224 among the supporter patterns 222. As shown in at least FIG. 16, side surfaces 222-S of the supporter patterns 222 may at least partially define, at least in the horizontal plane (e.g., D1-D2 plane), the open region 224 extending between the supporter patterns 222. As shown in at least FIG. 16, side surfaces 222-S of the support patterns 222 and exposed side surfaces of the lower electrodes 160 (e.g., side surfaces of the lower electrodes 160 that are exposed by and/or from the supporter patterns 222) may at least partially define, at least in the horizontal plane (e.g., D1-D2 plane), the open region 224 extending among (e.g., between) the supporter patterns 222 in one or more horizontal directions D1 and/or D2 The second supporter structure 220 may have a structure similar to that of the first supporter structure 120. For example, the supporter pattern 222 of the second supporter structure 220 may be surrounded by the open region 224. Each supporter pattern 222 may partially contact six lower electrodes 160, and may surround one lower electrode 160. A side surface of the supporter pattern 222 may contact the lower electrode 160, and may be concave.

Referring to FIG. 17, the supporter pattern 122, and the supporter pattern 222, which is disposed on the supporter pattern 122, may not be vertically aligned with each other. For example, the supporter pattern 122 may partially overlap with the supporter pattern 222 (e.g., in the vertical direction D3). In addition, the supporter pattern 122 may share the lower electrodes 160 (e.g., share one or more lower electrodes 160) with the supporter pattern 222. For example, the supporter pattern 122 may share two lower electrodes 160 disposed at a circumference thereof with the supporter pattern 222. Accordingly, the supporter pattern 122 and the supporter pattern 222 may support twelve lower electrodes 160 while interconnecting the twelve lower electrodes 160. As the supporter patterns 122 and 222 are disposed to partially overlap with each other, as described above, it may be possible to reduce or prevent leaning and bending of the lower electrode 160.

Referring to FIG. 18, a semiconductor device 300 may include a supporter pattern 322 supporting lower electrodes 160. In some example embodiments, a supporter pattern 122 may share the lower electrodes 160 with the supporter pattern 322. For example, the supporter pattern 122 may share three lower electrodes 160 disposed at a circumference thereof and one lower electrode 160 disposed inside thereof with the supporter pattern 322. As such, the supporter pattern 122 and the supporter pattern 322 may support ten lower electrodes 160 while interconnecting the ten lower electrodes 160.

Figure 19:
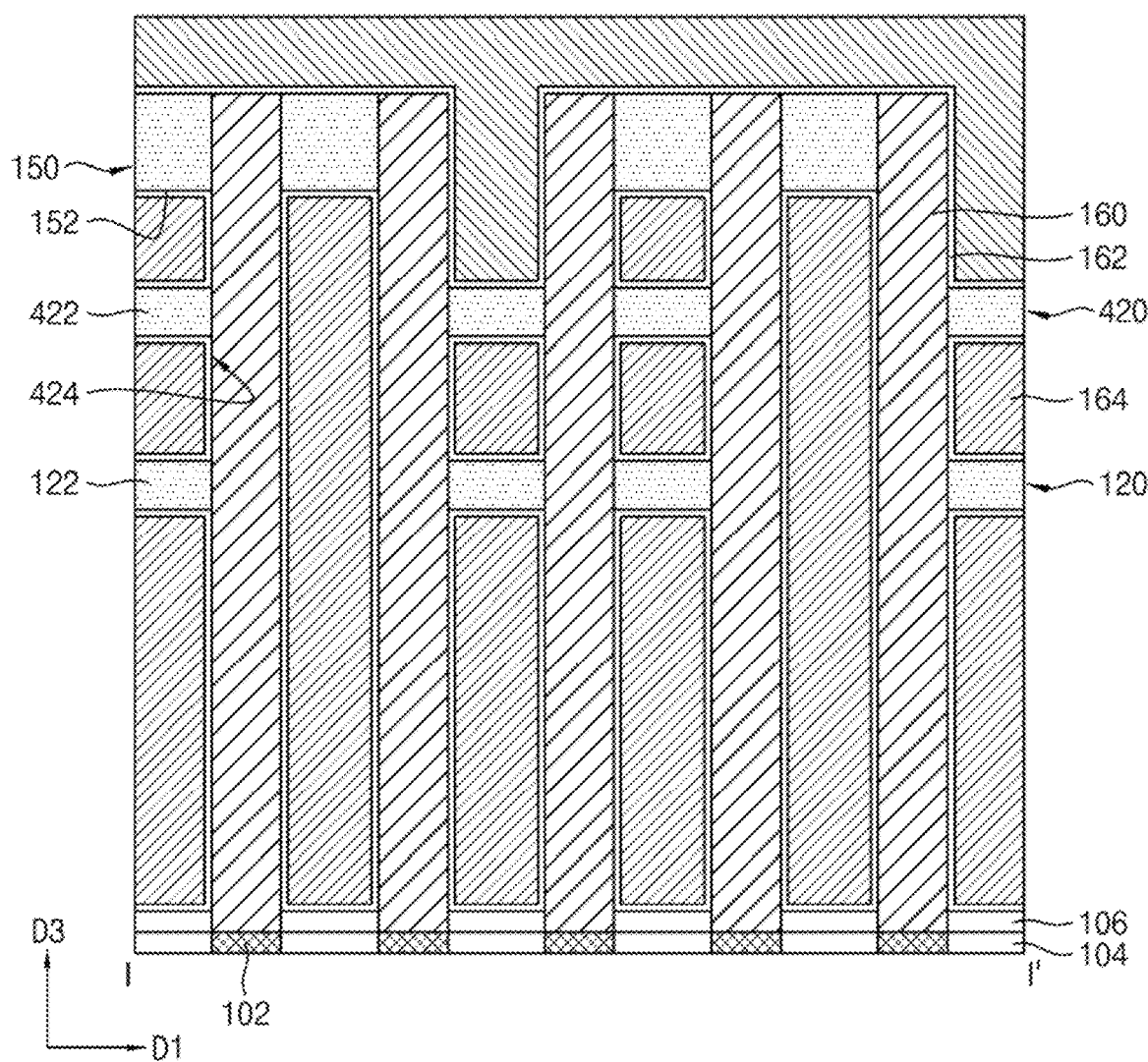
FIGS. 19 and 20 are vertical cross-sectional views of semiconductor devices according to example embodiments of the inventive concepts.
Figure 20:
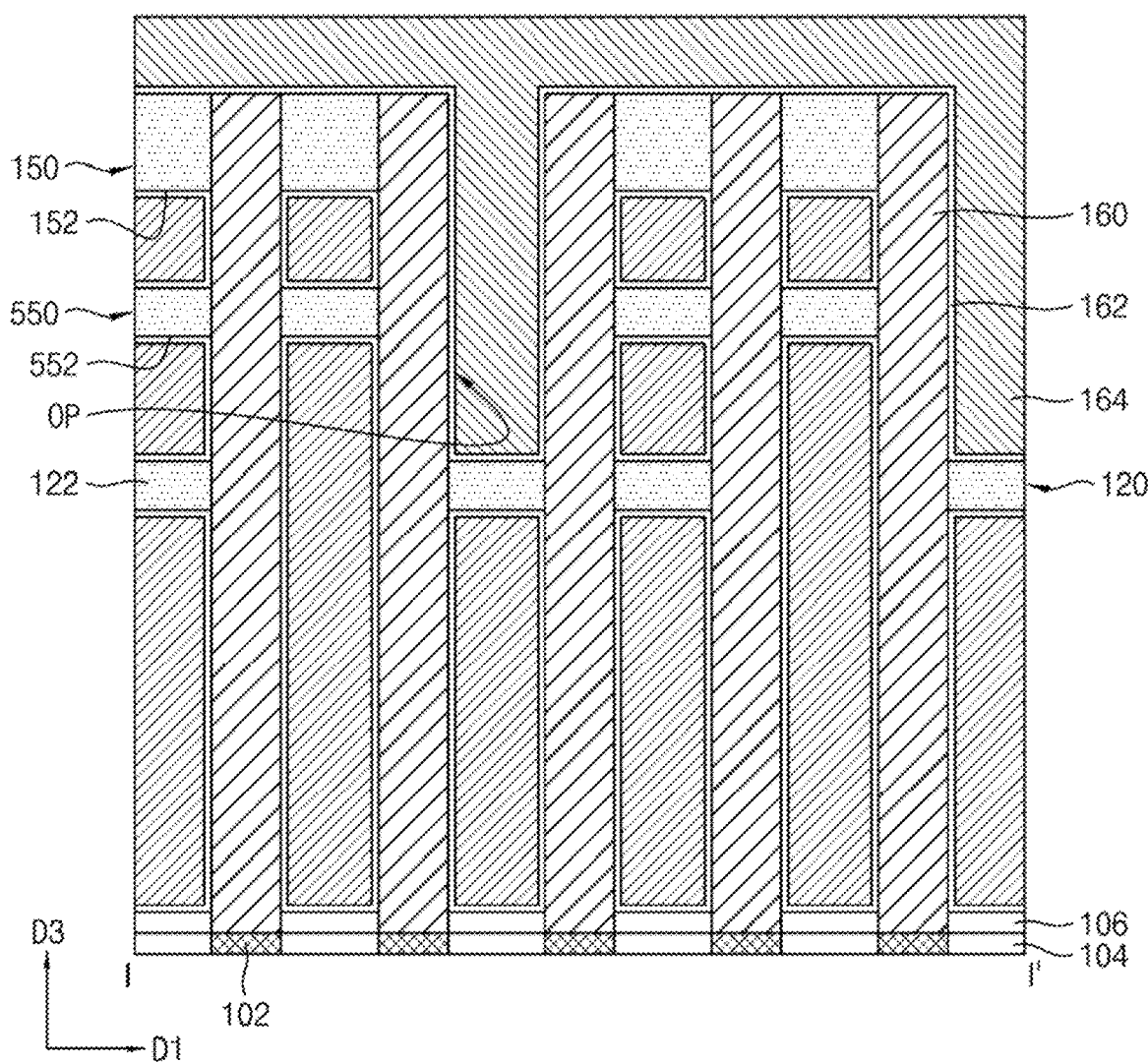

FIGS. 19 and 20 are vertical cross-sectional views of semiconductor devices according to example embodiments of the inventive concepts.

Referring to FIG. 19, a semiconductor device 400 may further include a third supporter structure 420 supporting lower electrodes 160. The third supporter structure 420 may be disposed on a first supporter structure 120, and may be disposed under a second supporter structure 150. The thickness of the third supporter structure 420 may be smaller than the thickness of the second supporter structure 150. For example, the thickness of the third supporter structure 420 may be equal to the thickness of the first supporter structure 120, without being limited thereto. In some example embodiments, the third supporter structure 420 may be patterned in the same manner as the first supporter structure 120. For example, the third supporter structure 420 may include supporter patterns 422, and an open region 424 among the supporter patterns 422. The supporter pattern 422 of the third supporter structure 420 may vertically overlap with a supporter pattern 122 of the first supporter structure 120 in a manner described with reference to FIGS. 17 and 18.

Referring to FIG. 20, a semiconductor device 500 may further include a third supporter structure 550 supporting lower electrodes 160. The third supporter structure 550 may be disposed on a first supporter structure 120, and may be disposed under a second supporter structure 150. In some example embodiments, the third supporter structure 550 may be patterned in the same manner as the second supporter structure 150. For example, the third supporter structure 550 may include a supporter plate 552, and open holes OP formed inside of the supporter plate 552.

Figure 21:
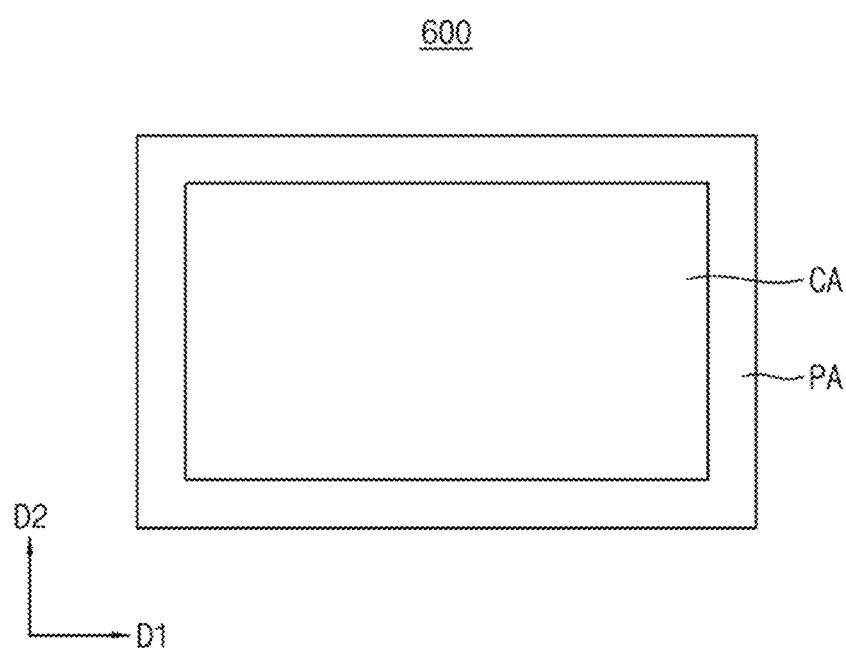
FIG. 21 is a planar layout of a semiconductor device according to an example embodiments of the inventive concepts.
Figure 22:
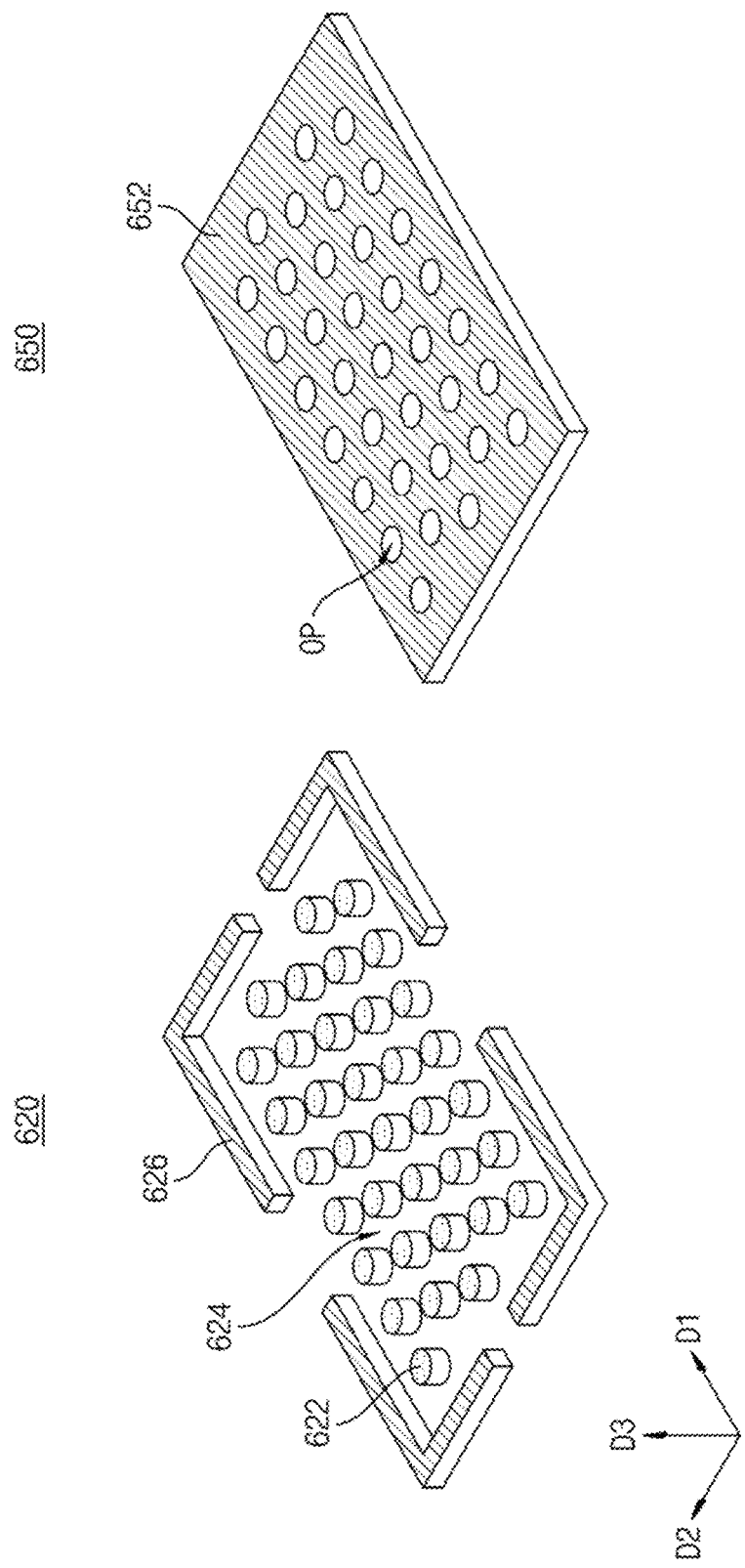
FIG. 22 is perspective views of supporter structures according to some example embodiments of the inventive concepts.

FIG. 21 is a planar layout of a semiconductor device according to some example embodiments of the inventive concepts. FIG. 22 is perspective views of supporter structures according to some example embodiments of the inventive concepts.

Referring to FIG. 21, a semiconductor device 600 may include a cell area CA and a peripheral circuit area PA. The cell area CA may represent an area in which a memory cell of a DRAM device is disposed, and the peripheral circuit area PA may mean an area in which a row decoder, a sense amplifier, etc. may be disposed. For example, the peripheral circuit area PA may surround the cell area CA.

Figure 23:
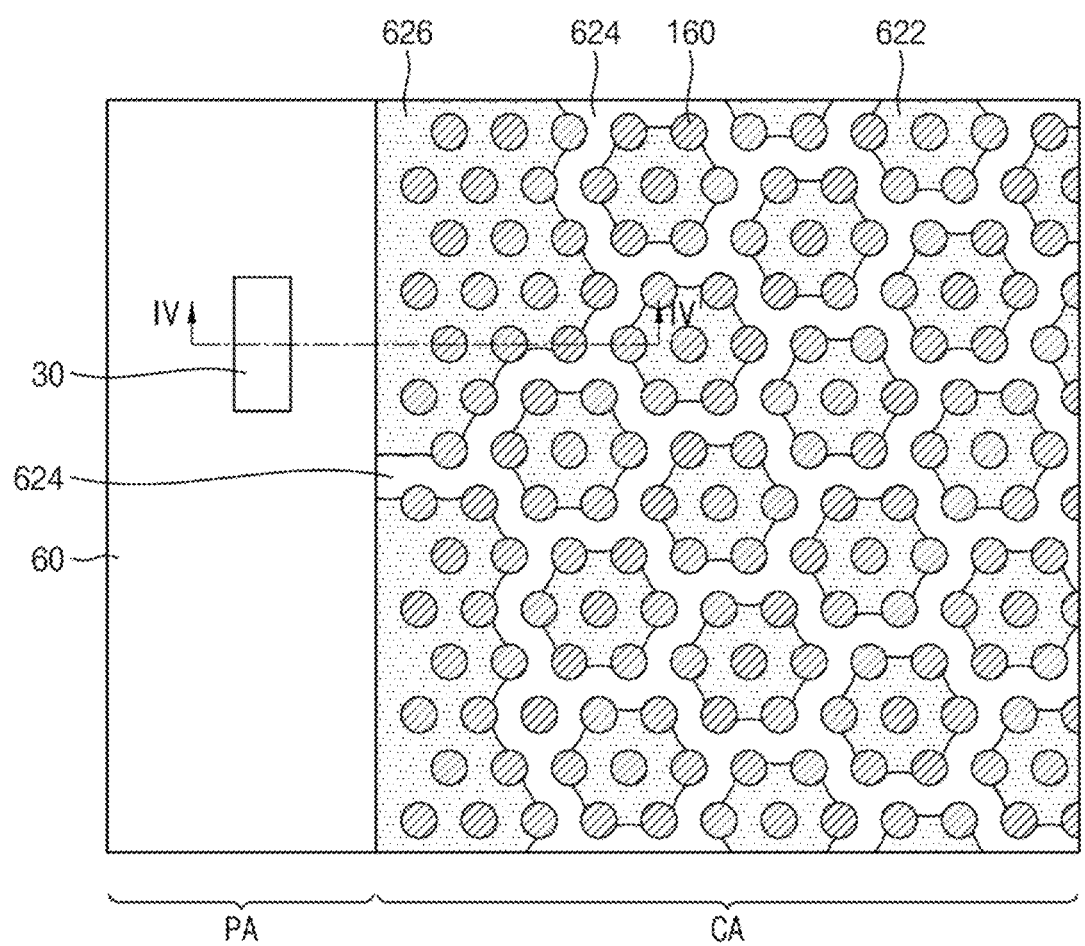
FIG. 23 is an enlarged view of the supporter structures shown in FIG. 22.

Referring to FIGS. 22 and 23, a first supporter structure 620 may include supporter patterns 622, an open region 624, and dam structures 626. The supporter patterns 622 and the open region 624 may have structures identical or similar to those of the supporter patterns 122 and the open region 124 described with reference to FIG. 1A. The dam structures 626 may be disposed to surround the supporter patterns 622. For example, the dam structures 626 may be disposed along an edge of the cell region CA, and the supporter patterns 622 may be disposed within the cell area CA while being surrounded by the dam structures 626. In addition, the dam structures 626 may be disposed to be spaced apart from one another. For example, adjacent ones of the dam structures 626 may be spaced apart from each other in a first horizontal direction D1 or a second horizontal direction D2, and the open region 624 may extend between the adjacent dam structures 626. In some example embodiments, each of the dam structures 626 may have a bent shape in which structures are coupled to each other. When the dam structures 626 are integrally formed to surround the supporter patterns 622, the dam structures 626 may exhibit possibility of weakness against warpage of the semiconductor device. However, when the dam structures 626 are disposed to be spaced apart from one another, as shown in FIG. 22, it may be possible to reduce failure rate of the semiconductor device.

A second supporter structure 650 may include a supporter plate 652, and open holes OP formed inside of the supporter plate 652. The supporter plate 652 and the open holes OP may have structures identical or similar to those of the supporter plate 152 and the open holes OP described with reference to FIG. 1C.

Figure 24:
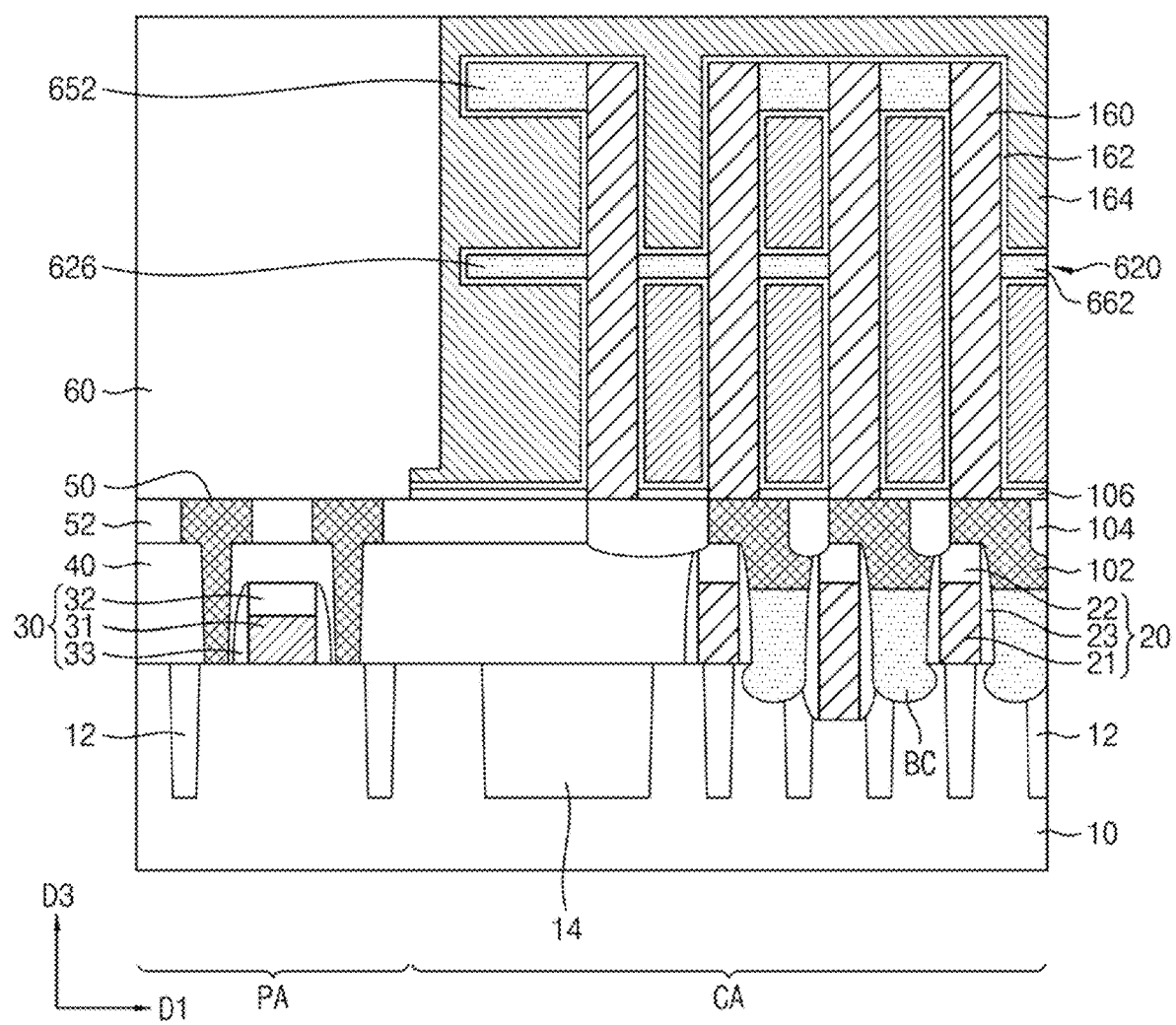
FIG. 24 is a vertical cross-sectional view of the supporter structure shown in FIG. 23.

FIG. 23 is an enlarged view of the supporter structure shown in FIG. 22. FIG. 24 is a vertical cross-sectional view of the supporter structure shown in FIG. 23.

Referring to FIG. 23, the first supporter structure 620 may include the supporter patterns 622, the open region 624, and the dam structures 626, as described above, and the open region 624 may extend among the dam structures 626 while surrounding the supporter patterns 622. The distance between adjacent ones of the dam structures 626 may be smaller than or equal to the pitch of the lower electrodes 160. For example, the distance between side surfaces of the adjacent dam structures 626 or the horizontal width of the open region 624 between the adjacent dam structures 626 may be smaller than or equal to the distance between centers of adjacent ones of the lower electrodes 160. The dam structures 626 may contact the lower electrodes 160. For example, a part of the lower electrodes 160 may partially contact the dam structure 626 or may be surrounded by the dam structure 626.

Referring to FIG. 24, the semiconductor device 600 may include a substrate 10, a bit line structure 20, a gate structure 30, an interlayer insulating layer 40, a contact plug 50, a lower insulating layer 52, and an upper insulating layer 60.

The substrate 10 may include the cell area CA and the peripheral circuit area PA. The substrate 10 may include a semiconductor material. For example, the substrate 10 may be a silicon substrate, a germanium substrate, a silicon-germanium substrate, or a silicon-on-insulator (SOI) substrate.

The substrate 10 may include an element isolation layer 12 and a region isolation layer 14. The element isolation layer 12 may be an insulating layer extending downwards from an upper surface of the substrate 10, and may define active regions in the cell area CA. For example, the active region may correspond to a portion of the upper surface of the substrate 10 surrounded by the element isolation layer 12. The region isolation layer 14 may define the peripheral circuit area PA. The region isolation layer 14 may be an insulating layer extending downwards from the upper surface of the substrate 10. The region isolation layer 14 may electrically insulate the active region from a portion of the substrate 10 in the peripheral circuit area PA.

The bit line structure 20 may be disposed on the substrate 10, and may include a bit line 21, a bit line capping layer 22, and a bit line spacer 23. The bit line 21 may include TiN, TiSiN, W, tungsten silicide, polysilicon, or a combination thereof. The bit line capping layer 22 may cover an upper surface of the bit line 21, and may include silicon nitride.

Bit line spacers 23 may be disposed at opposite side surfaces of bit lines 21, respectively. A part of bit line spacers 23 may further extend into a recess of the substrate 10. The bit line spacers 23 may include silicon oxide, silicon nitride, silicon oxynitride, or a combination thereof.

A buried contact BC may be disposed among bit line structures 20. An upper surface of the buried contact BC may be disposed at a lower level than an upper surface of the bit line capping layer 22. The buried contact BC may extend into the substrate 10. For example, a lower end of the buried contact BC may be disposed at a lower level than the upper surface of the substrate 10, and may contact the active region. In some example embodiments, the buried contact BC may include polysilicon.

The semiconductor device 100 may further include a landing pad 102 and an insulating structure 104, and the landing pad 102 and the insulating structure 104 may correspond to the landing pad 102 and the insulating structure 104 shown in FIG. 1B. The landing pad 102 may be disposed on the buried contact BC. For example, a bottom surface of the landing pad 102 may be disposed at a lower level than the upper surface of the bit line capping layer 22, and may contact the buried contact BC. The landing pad 102 may be electrically connected to the active region via the buried contact BC.

Insulating structures 104 may be disposed among landing pads 102. The insulating structures 104 may electrically insulate the landing pads 102 from one another. The insulating structures 104 may contact the bit line capping layer 22. An upper surface of the insulating structure 104 may be coplanar with an upper surface of the landing pad 102. In some example embodiments, the landing pad 102 may include tungsten, and the insulating structure 104 may include silicon oxide.

The gate structure 30 may be disposed adjacent to the element isolation layer 12 in the peripheral circuit area PA. The gate structure 30 may include a gate electrode 31, a gate capping layer 32 covering an upper surface of the gate electrode 31, and a gate spacer 33 covering a side surface of the gate electrode 31.

The interlayer insulating layer 40 may extend from the cell area CA to the peripheral circuit area PA, and may be disposed on the substrate 10. The interlayer insulating layer 40 may be disposed on the element isolation layer 12 and the region isolation layer 14, and may cover the gate structure 30. The interlayer insulating layer 40 may include silicon oxide, silicon nitride, silicon oxynitride, or a combination thereof.

The contact plug 50 may be disposed in the peripheral circuit area PA, and may be disposed adjacent to the gate structure 30. The contact plug 50 may extend through the interlayer insulating layer 40 and, as such, may contact the active region of the substrate 10 adjacent to the gate structure 30.

The lower insulating layer 52 may be disposed on the interlayer insulating layer 40, and may extend from the cell area CA to the peripheral circuit area PA. A portion of the contact plug 50 may extend through the lower insulating layer 52. The lower insulating layer 52 may include silicon oxide, silicon nitride, silicon oxynitride, or a combination thereof.

The upper insulating layer 60 may be disposed on the contact plug 50 and the lower insulating layer 52 in the peripheral circuit area PA. The upper insulating layer 60 may be disposed at the same level as an upper electrode 164. The upper insulating layer 60 may include silicon oxide, silicon nitride, silicon oxynitride, or a combination thereof.

In accordance with the example embodiments of the inventive concepts, a semiconductor device may include a supporter structure having a great open ratio and, as such, reliability and productivity of the semiconductor device may be secured.

While some example embodiments of the inventive concepts have been described with reference to the accompanying drawings, it should be understood by those skilled in the art that various modifications may be made without departing from the scope of the inventive concepts and without changing essential features thereof. Therefore, the above-described example embodiments should be considered in a descriptive sense only and not for purposes of limitation.

What is claimed is:

1. A semiconductor device, comprising:
   lower electrodes;
   a first supporter structure including first supporter patterns interconnecting the lower electrodes, wherein side surfaces of the first supporter patterns and side surfaces of the lower electrodes that are exposed by the first supporter patterns at least partially define a first open region, the first supporter patterns spaced apart from one another, the first open region extending among the first supporter patterns in a horizontal direction;
   a dielectric layer covering the first supporter structure and the lower electrodes;
   a second supporter structure on the first supporter structure and spaced apart from the frst supporter structure in a vertical direction, the second supporter structure interconnecting the lower electrodes; and
   an upper electrode on the dielectric layer,
   wherein a distance between adjacent ones of the first supporter patterns is smaller than or equal to a pitch of the lower electrodes.

2. The semiconductor device according to claim 1, wherein at least one first supporter pattern of the first supporter patterns partially contacts six lower electrodes of the lower electrodes that are at a circumference of the first supporter pattern, and surrounds one lower electrode of the lower electrodes.

3. The semiconductor device according to claim 2, wherein an angle between a side surface of at least one of the six lower electrodes and a side surface of the at least one first supporter pattern is greater than 90°.

4. The semiconductor device according to claim 2, wherein, in a plan view, the one lower electrode that is surrounded by the at least one first supporter pattern is not in contact with the dielectric layer.

5. The semiconductor device according to claim 2, wherein the dielectric layer extends along side surfaces of the at least one first supporter pattern and the six lower electrodes partially contacted by the at least one first supporter pattern.

6. The semiconductor device according to claim 1, wherein a side surface of each of the first supporter patterns is concave.

7. The semiconductor device according to claim 1, wherein an upper surface of the first supporter structure is at a lower level than upper surfaces of the lower electrodes.

8. The semiconductor device according to claim 1,
   wherein the second supporter structure includes a supporter plate interconnecting the lower electrodes, the supporter plate having inner walls that at least partially define separate, respective open holes inside the supporter plate,
   wherein the open holes are spaced apart from one another, and the supporter plate extends among the open holes in the horizontal direction.

9. The semiconductor device according to claim 8, wherein the open holes each at least partially expose three separate lower electrodes that are adjacent to one another from the supporter plate.

10. The semiconductor device according to claim 9, wherein the dielectric layer covers side surfaces of the lower electrodes that are exposed by the first support patterns and at least one inner wall of the supporter plate.

11. The semiconductor device according to claim 1,
    wherein the second supporter structure includes second supporter patterns interconnecting the lower electrodes, and wherein side surfaces of the second supporter patterns and side surfaces of the lower electrodes exposed by the second supporter patterns at least partially define a second open region,
    wherein the second supporter patterns are spaced apart from one another, and the second open region extends among the second supporter patterns in the horizontal direction.

12. The semiconductor device according to claim 11, wherein at least one of the first supporter patterns partially overlaps with a corresponding one of the second supporter patterns.

13. The semiconductor device according to claim 11, wherein at least one of the first supporter patterns shares one or more lower electrodes with a corresponding one of the second supporter patterns.

14. A semiconductor device comprising:
    a substrate including a cell area and a peripheral circuit area;
    lower electrodes on the substrate in the cell area;
    a first supporter structure including first supporter patterns interconnecting the lower electrodes, wherein side surfaces of the first supporter patterns and side surfaces of the lower electrodes that are exposed by the first supporter patterns at least partially define a first open region, and dam structures at an edge of the cell area, the first open region extending among the first supporter patterns in a horizontal direction, the dam structures spaced apart from one another;

a dielectric layer covering the first supporter structure and the lower electrodes; and an upper electrode on the dielectric layer, wherein a distance between adjacent ones of the first supporter patterns is smaller than or equal to a pitch of the lower electrodes.

15. The semiconductor device according to claim 14, wherein the first open region extends among the dam structures.

16. The semiconductor device according to claim 14, wherein the dam structures are spaced apart from the first supporter patterns, and the dam structures surround the first supporter patterns.

17. The semiconductor device according to claim 14, wherein a distance between adjacent ones of the dam structures is smaller than or equal to the pitch of the lower electrodes.

18. The semiconductor device according to claim 14, wherein, in a plan view, the dam structures contact at least one of the lower electrodes.

19. A semiconductor device, comprising:

lower electrodes on landing pads, the lower electrodes defining a honeycomb structure;

a first supporter structure including first supporter patterns interconnecting the lower electrodes and wherein side surfaces of the first supporter patterns and side surfaces of the lower electrodes that are exposed by the first supporter patterns at least partially define a first open region, the first supporter patterns being spaced apart from one another, the first open region extending among the first supporter patterns in a horizontal direction;

a second supporter structure including a supporter plate interconnecting the lower electrodes and the supporter plate having inner walls that at least partially define separate, respective open holes inside the supporter plate, the second supporter structure being on the first supporter structure, an upper surface of the second supporter structure being at a same level as upper surfaces of the lower electrodes;

a dielectric layer covering the second supporter structure and the lower electrodes; and an upper electrode on the dielectric layer, wherein a distance between adjacent ones of the first supporter patterns is smaller than or equal to a pitch of the lower electrodes, wherein a thickness of the second supporter structure is greater than a thickness of the first supporter structure, and wherein the open holes are spaced apart from one another, and the supporter plate extends among the open holes in the horizontal direction.

20. The semiconductor device according to claim 19, wherein at least one of the first supporter patterns partially contacts six lower electrodes of the lower electrodes that are at a circumference thereof, and surrounds one lower electrode of the lower electrodes.

* * * * *